(12) United States Patent
Iizuka

(10) Patent No.: US 7,863,160 B2
(45) Date of Patent: Jan. 4, 2011

(54) WAFER PROCESSING METHOD INCLUDING FORMING BLOCKING AND DIVIDING GROOVES

(75) Inventor: Kentaro Iizuka, Tokyo (JP)

(73) Assignee: Disco Corporation, Tokyo (JP)

( * ) Notice: Subject to any disclaimer, the term of this patent is extended or adjusted under 35 U.S.C. 154(b) by 195 days.

(21) Appl. No.: 12/320,354

(22) Filed: Jan. 23, 2009

(65) Prior Publication Data

US 2009/0191693 A1   Jul. 30, 2009

(30) Foreign Application Priority Data

Jan. 29, 2008  (JP) .............................. 2008-017595

(51) Int. Cl.
*H01L 21/46* (2006.01)
*H01L 21/78* (2006.01)
*H01L 21/301* (2006.01)

(52) U.S. Cl. ..................................................... 438/463
(58) Field of Classification Search .................. 438/463; 257/E21.347

See application file for complete search history.

(56) References Cited

U.S. PATENT DOCUMENTS 7,772,092 B2 *   8/2010   Iizuka et al. ................. 438/463

FOREIGN PATENT DOCUMENTS

JP         2005-142389         6/2005

* cited by examiner

*Primary Examiner*—William M. Brewster
(74) *Attorney, Agent, or Firm*—Smith, Gambrell & Russell, LLP

(57) ABSTRACT

A method of processing a wafer having a plurality of devices which are composed of a laminate consisting of an insulating film and a functional film laminated on the front surface of a substrate, along streets for sectioning the devices, comprising a first trip blocking groove forming step for activating a first laser beam application means to form a blocking groove for dividing the laminate along a street of the wafer while moving the chuck table in a first direction in the processing-feed direction; a second trip blocking groove and dividing groove forming step for activating the first laser beam application means to form a blocking groove for dividing the laminate along a street and also to form a dividing groove along the blocking groove formed by the first trip blocking groove step while moving the chuck table in a second direction in the processing-feed direction.

4 Claims, 24 Drawing Sheets

Fig. 7
(a)
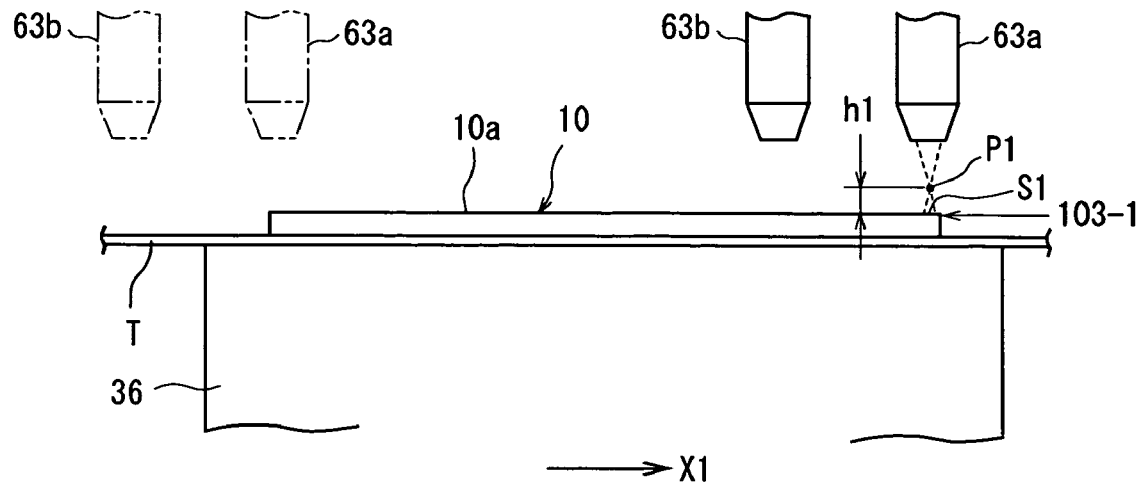
(b)
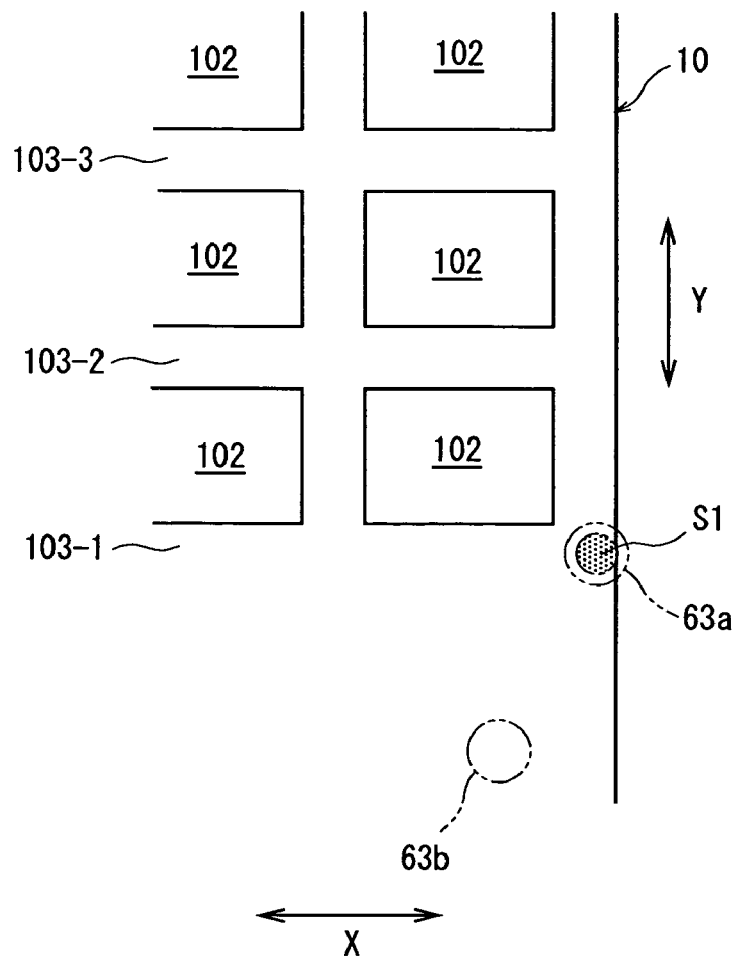

Fig. 9
(a)
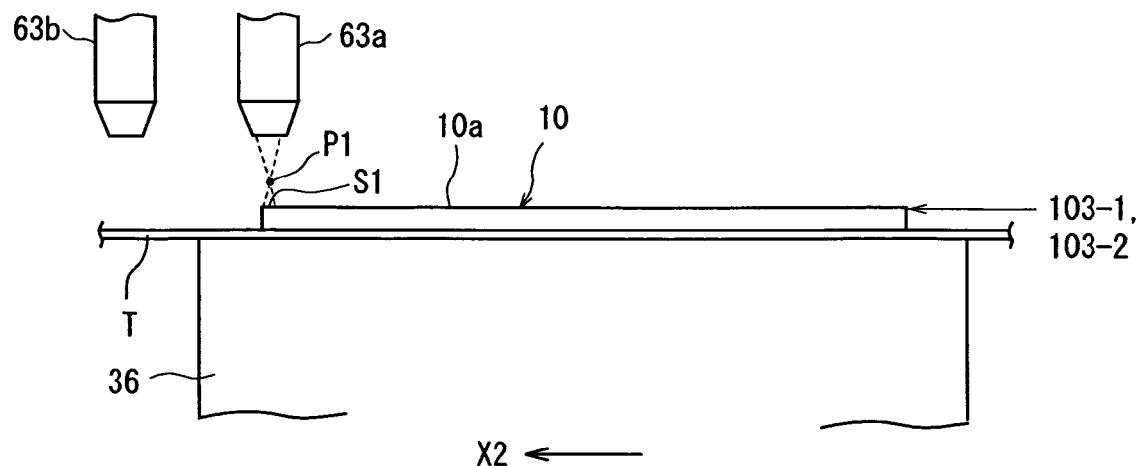
(b)
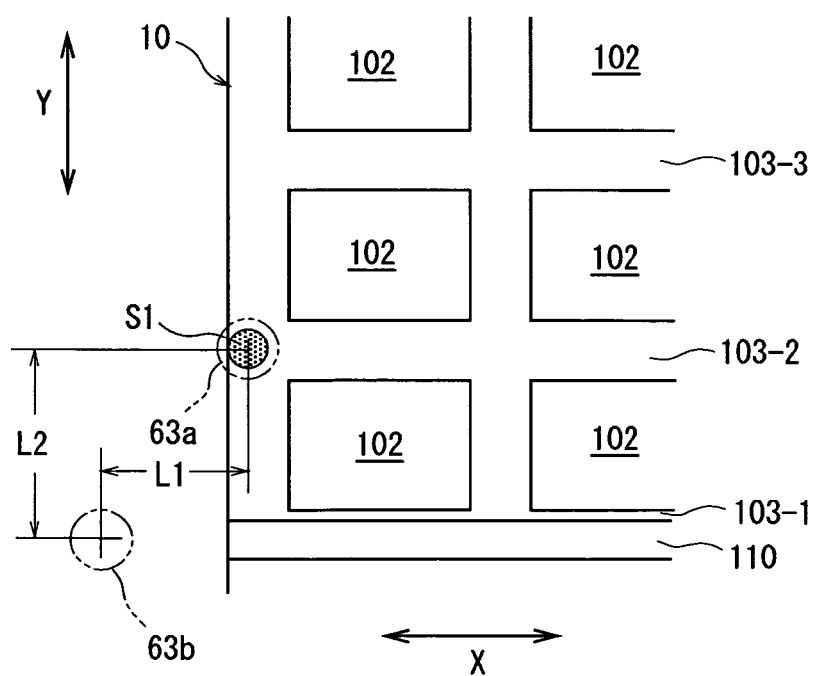

Fig. 10
(a)
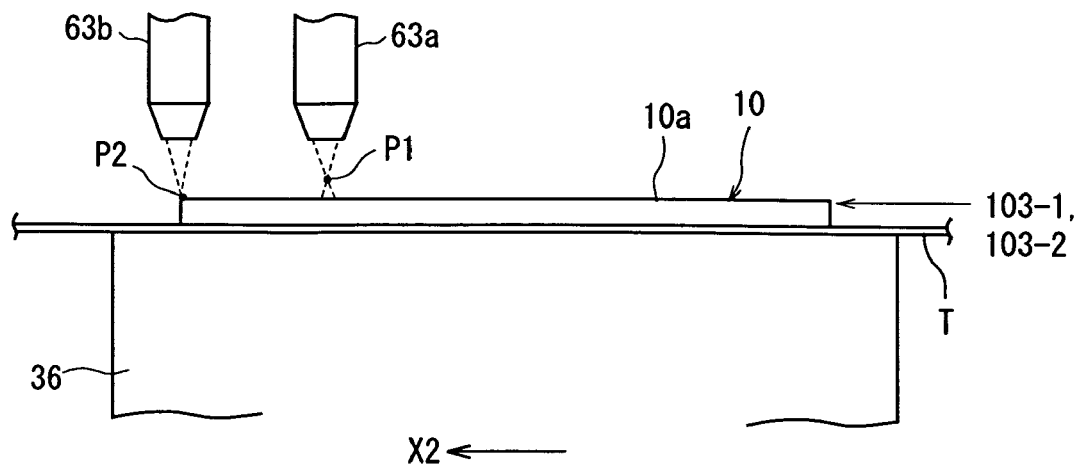
(b)
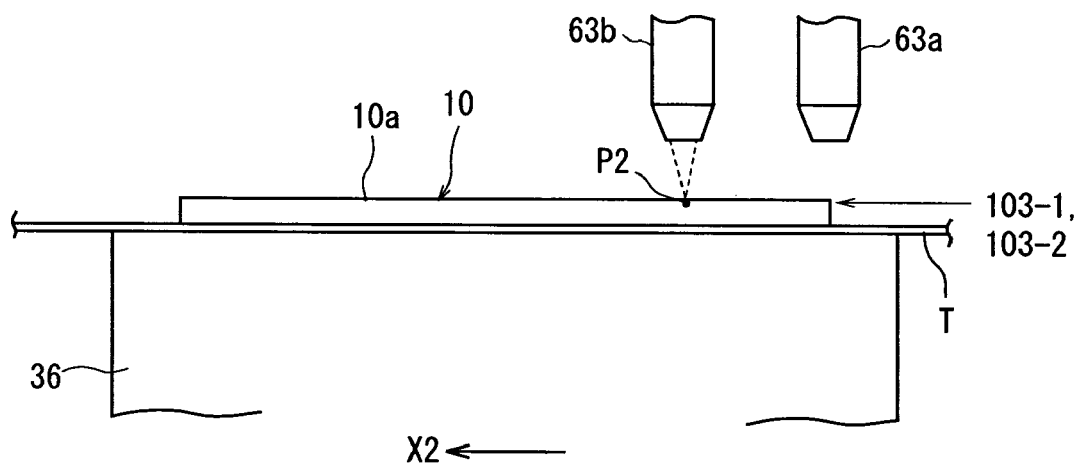
(c)
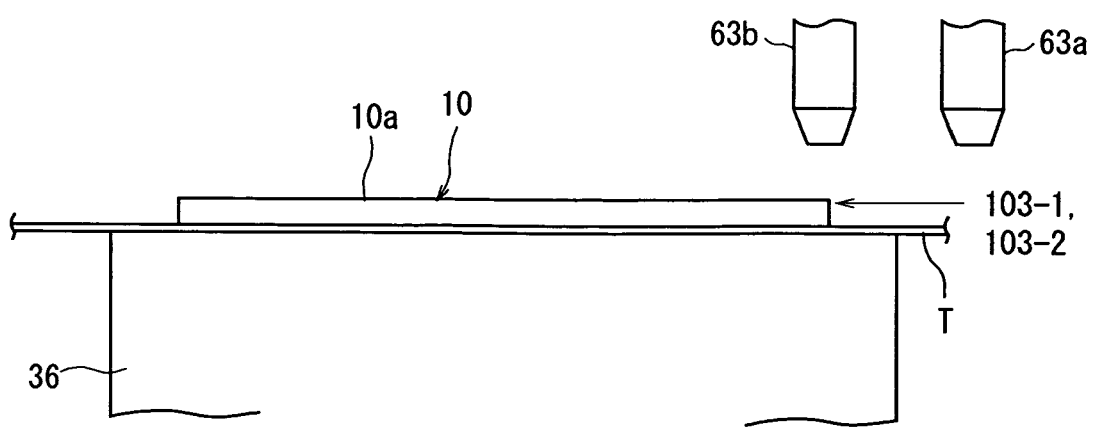

Fig. 12
(a)
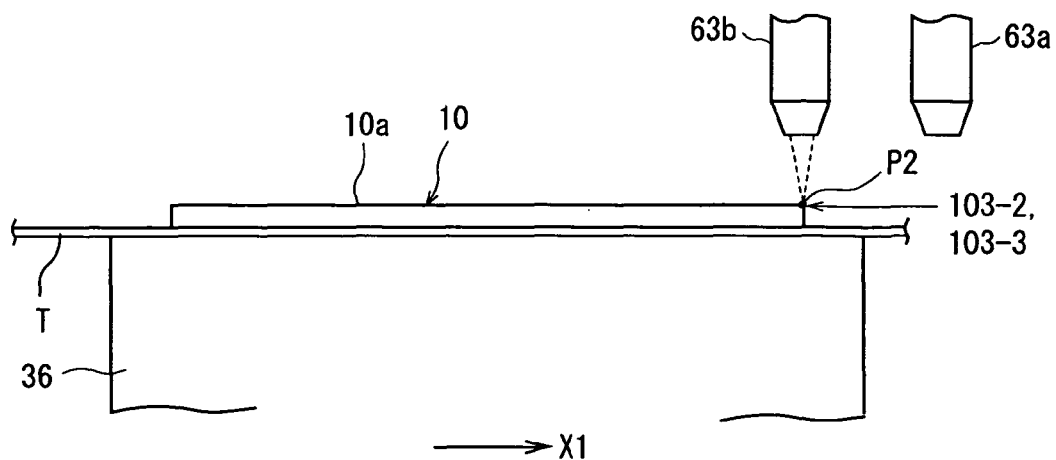
(b)
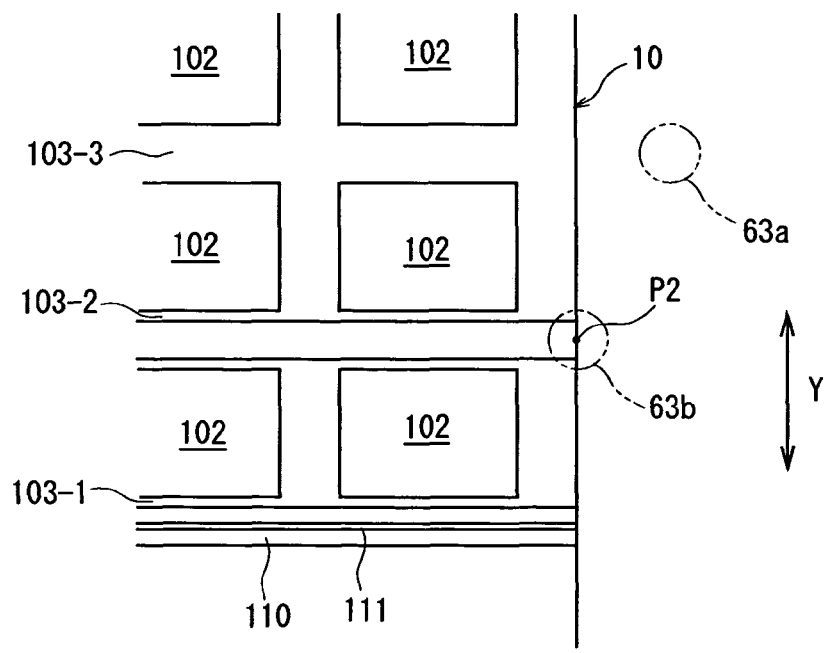

Fig. 13
(a)
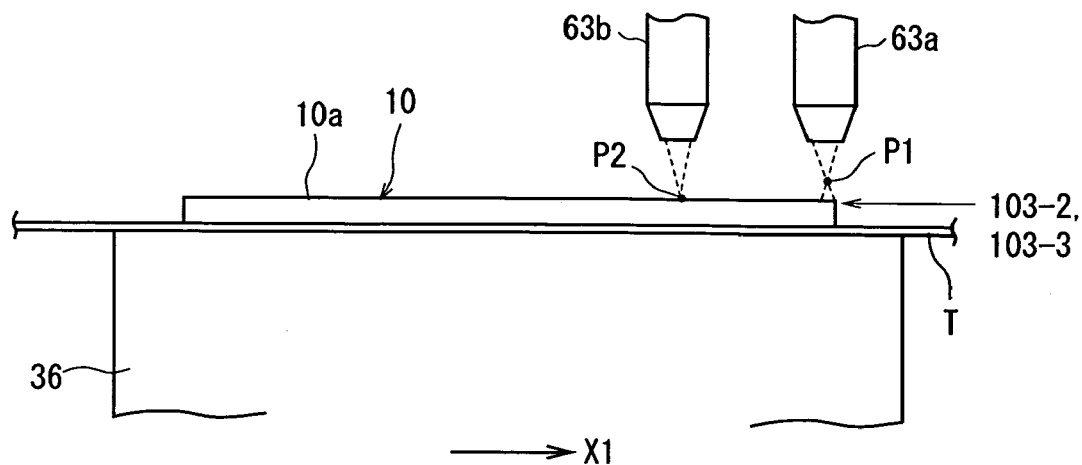
(b)
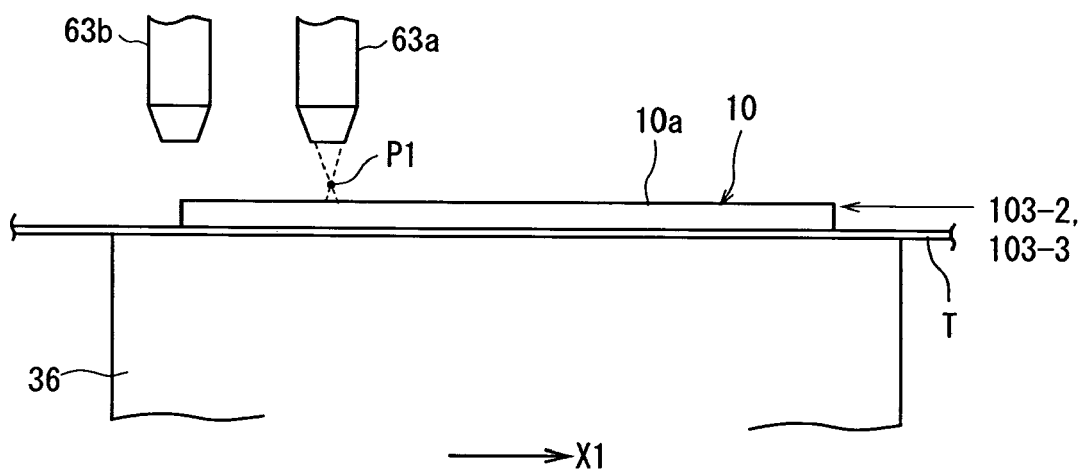
(c)
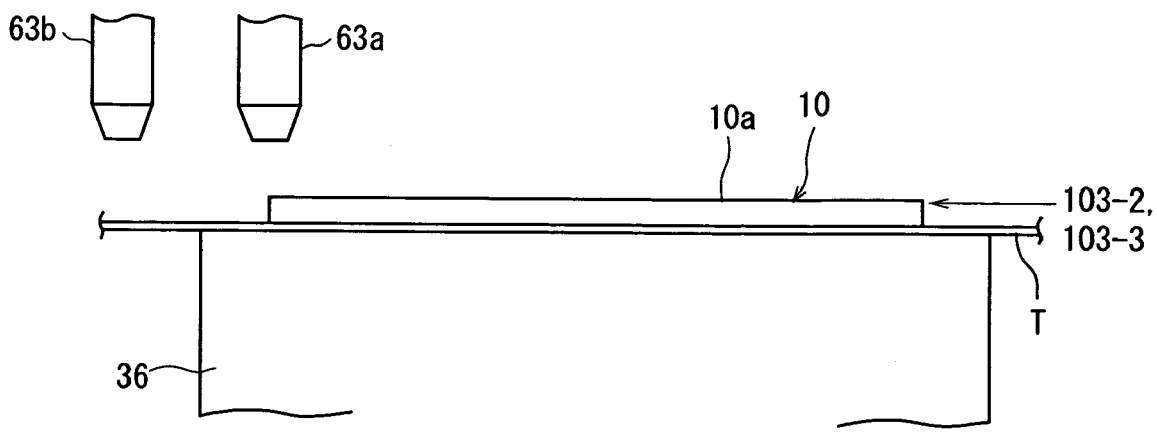

Fig. 16
(a)
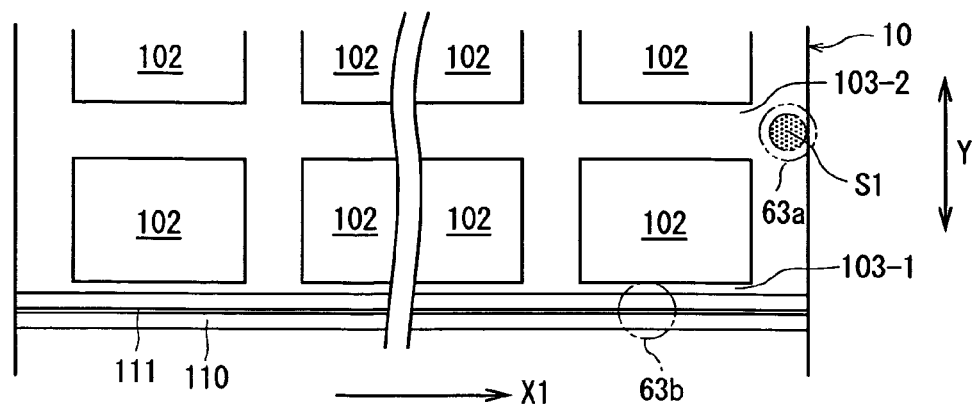
(b)
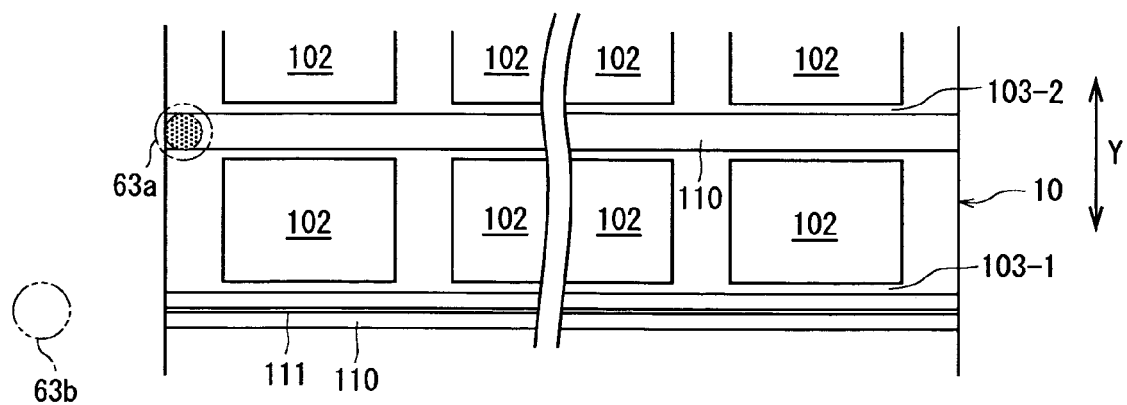

Fig. 20
(a)
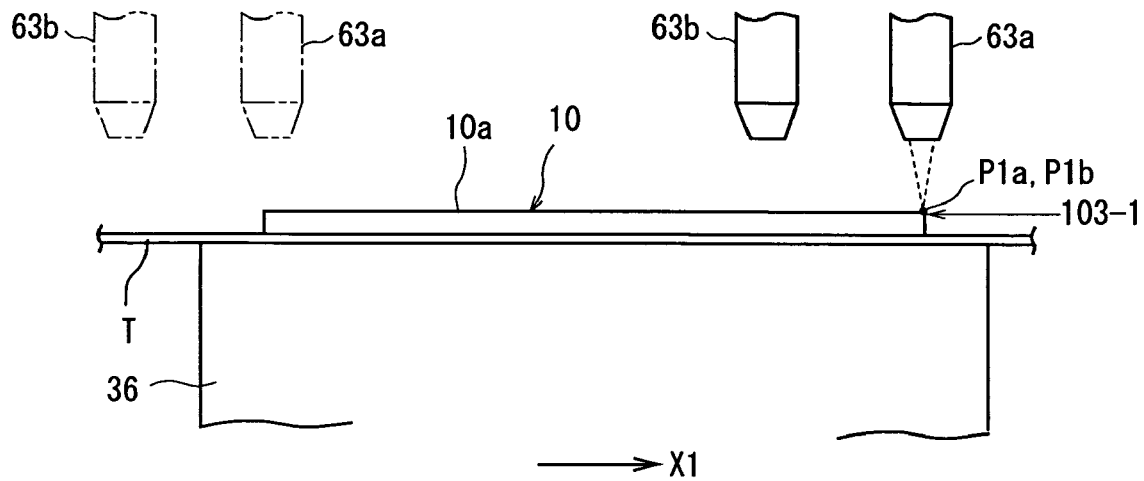
(b)
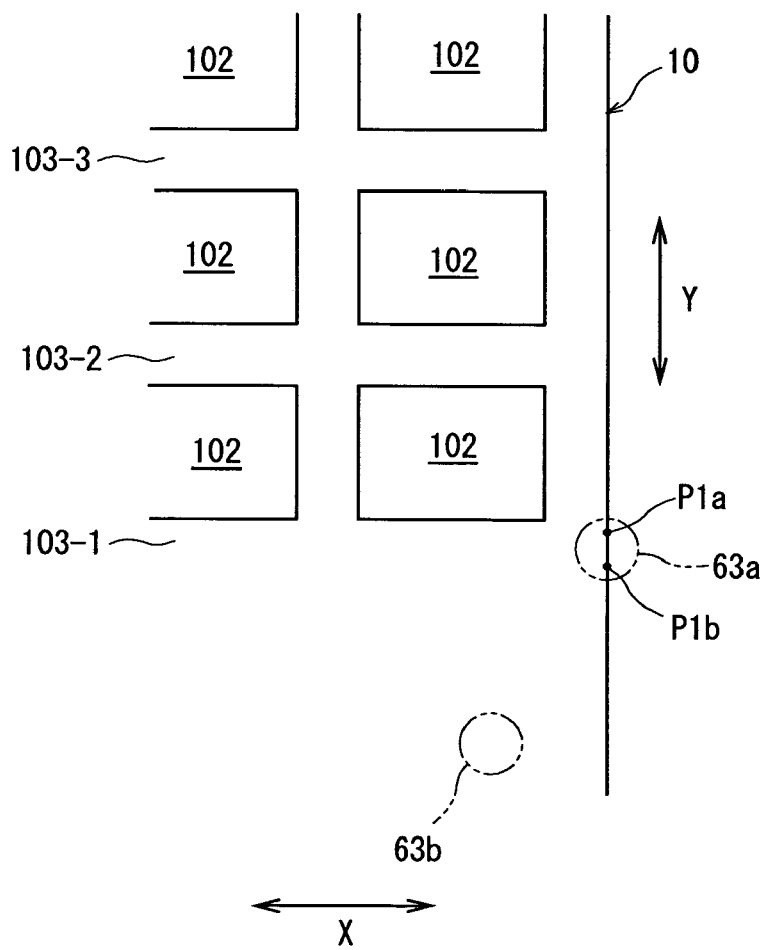

Fig. 22
(a)
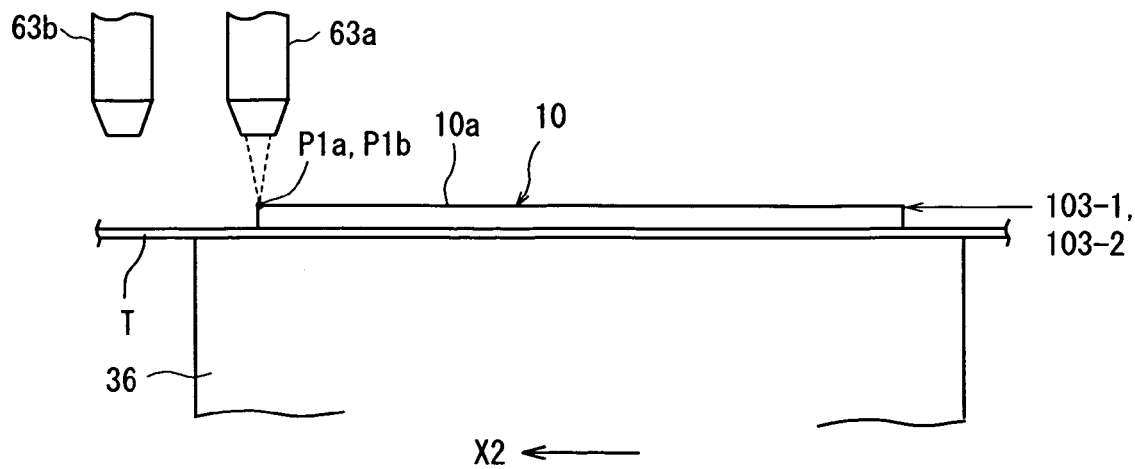
(b)
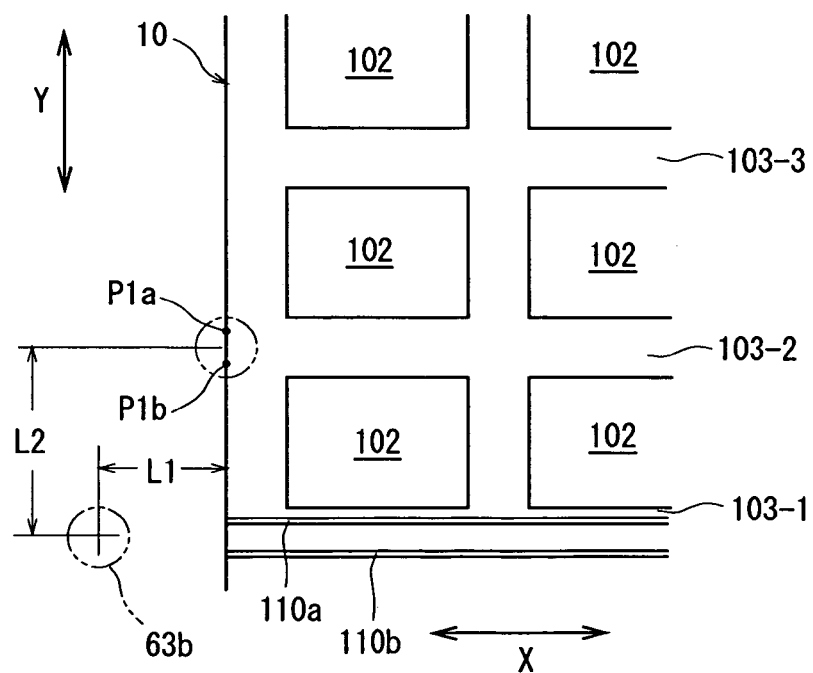

Fig. 23
(a)
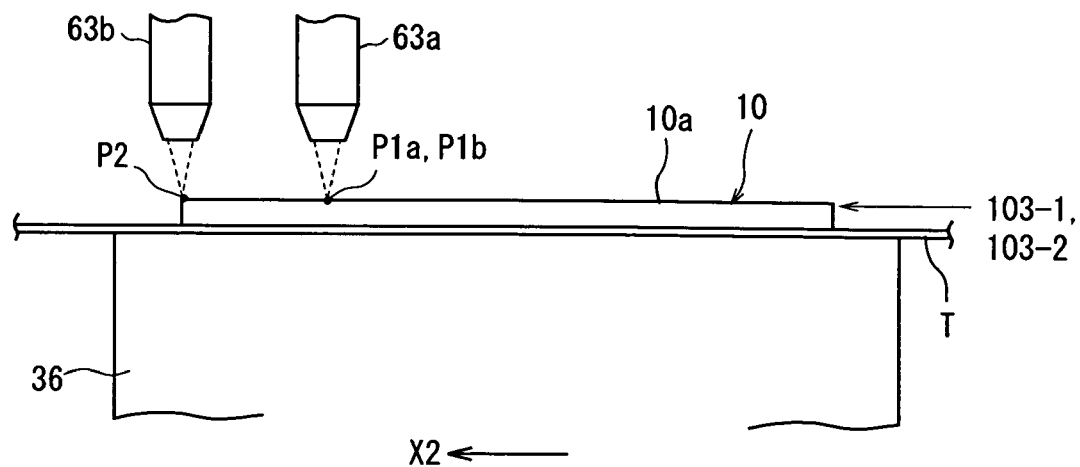
(b)
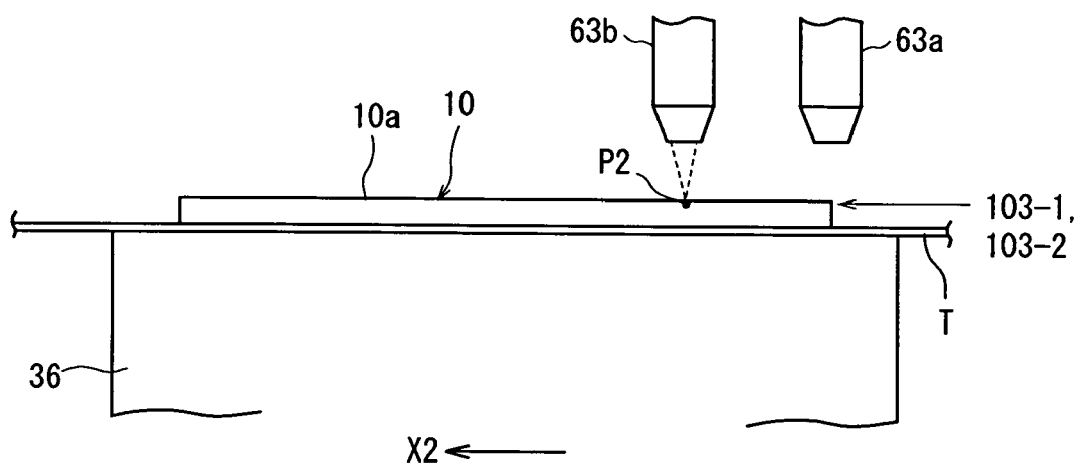
(c)
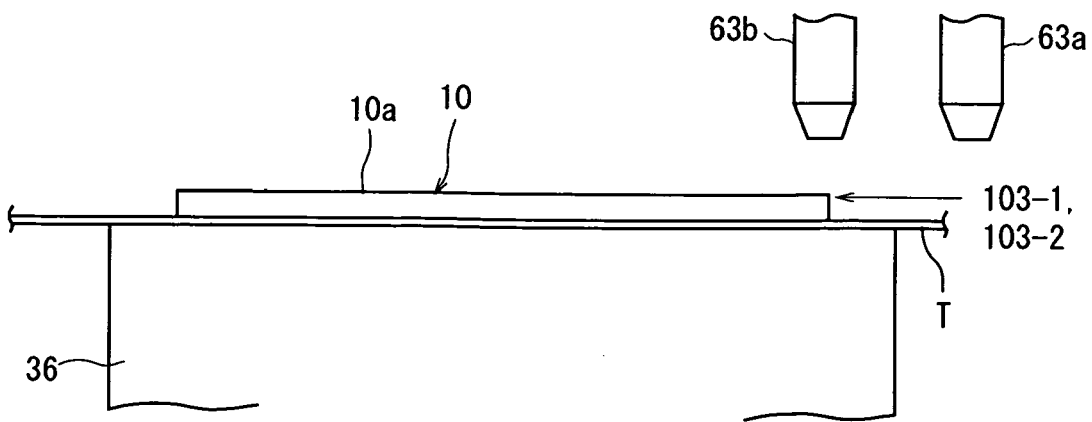

Fig. 25
(a)
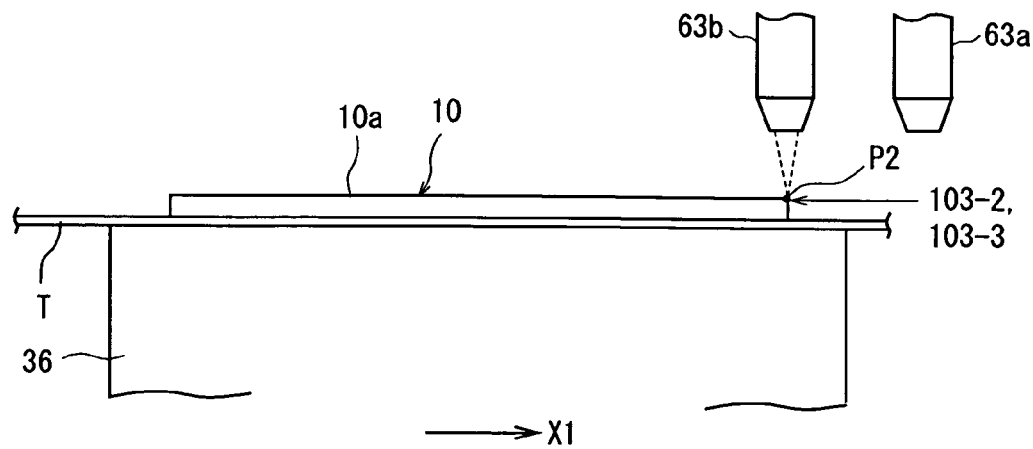
(b)
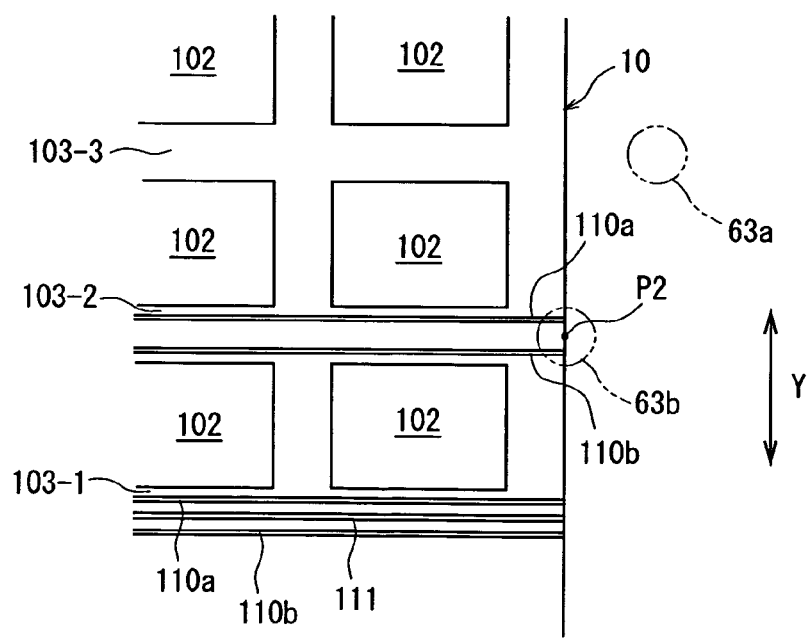

Fig. 26
(a)
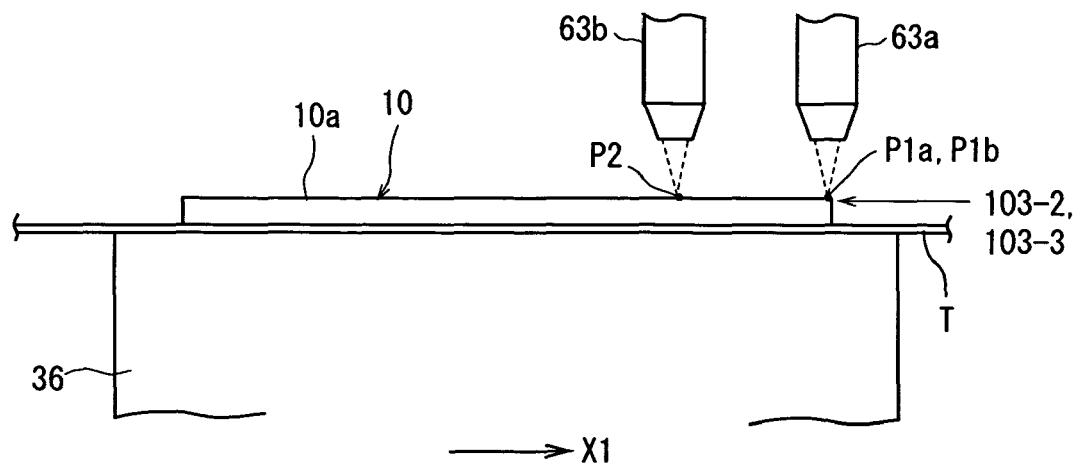
(b)
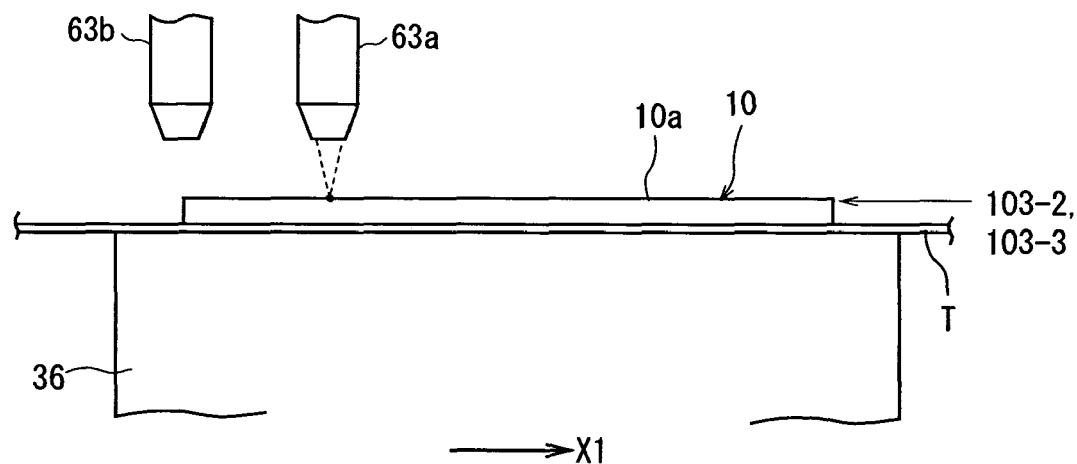
(c)
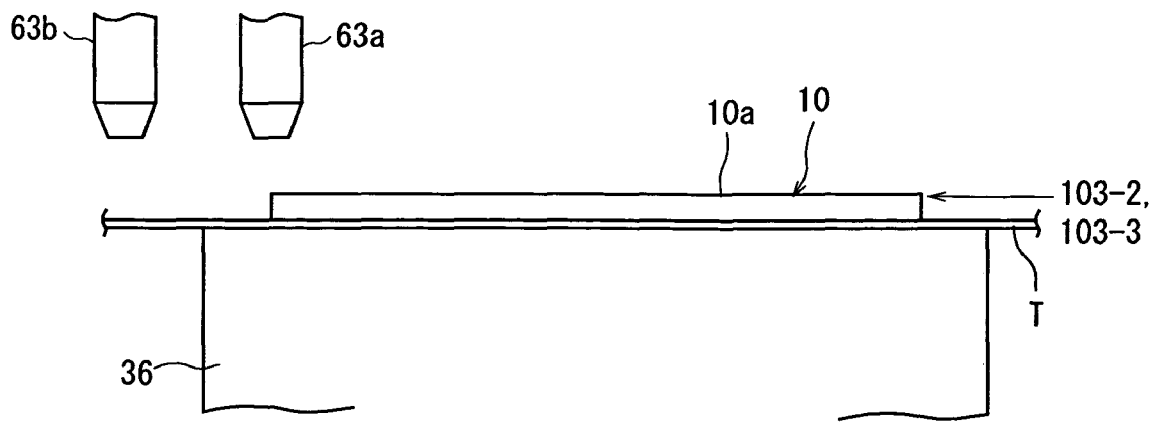

Fig. 29
(a)
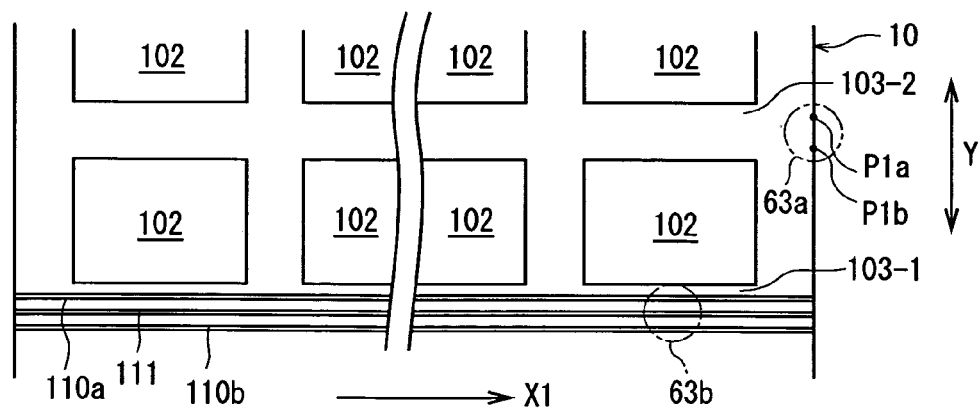
(b)
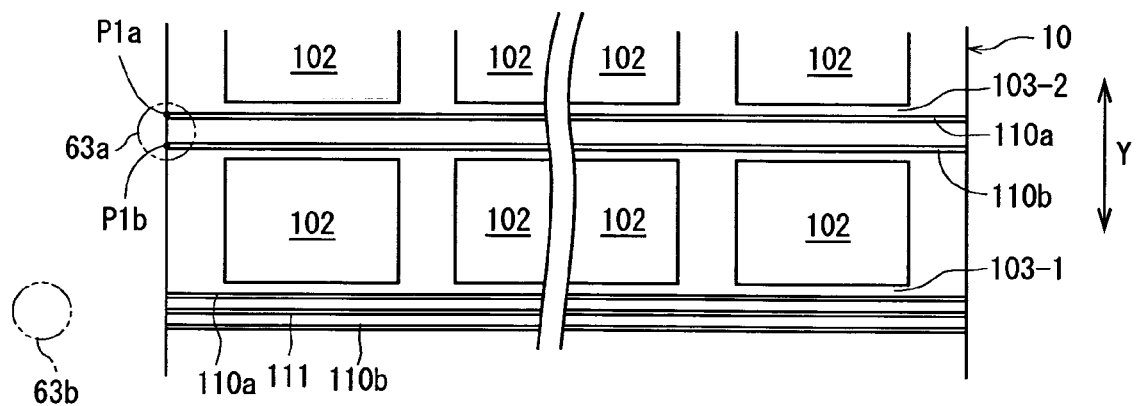

WAFER PROCESSING METHOD INCLUDING FORMING BLOCKING AND DIVIDING GROOVES

FIELD OF THE INVENTION

The present invention relates to a method of processing a wafer having a plurality of devices which are composed of a laminate consisting of an insulating film and a functional film on the front surface of a substrate, along streets for sectioning the plurality of devices.

DESCRIPTION OF THE PRIOR ART

As is known to people of ordinary skill in the art, a semiconductor wafer having a plurality of devices such as IC's or LSI's which are composed of a laminate consisting of an insulating film and a functional film and are formed in a matrix state on the front surface of a substrate such as a silicon substrate is formed in the production process of a semiconductor device. The above devices of the semiconductor wafer formed as described above are sectioned by dividing lines called "streets", and the semiconductor wafer is divided along the streets to manufacture individual devices.

Dividing along the streets of the above semiconductor wafer is generally carried out by using a cutting machine called "dicer". This cutting machine comprises a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle which is rotated at a high speed and a cutting blade mounted on the spindle. The cutting blade comprises a disk-like base and an annular cutting edge which is mounted on the outer peripheral side wall of the base and formed by fixing diamond abrasive grains having a diameter of about 3 μm to the base by electroforming.

To improve the throughput of a device such as IC or LSI, a semiconductor wafer having a configuration that devices are composed of a laminate consisting of a low-dielectric constant insulating film (low-k film) made of a glass material such as $SiO_2$, SiO or SiN and a functional film for forming circuits on the front surface of a substrate such as a silicon substrate has recently been implemented.

Since the above low-k film differs in the material from the substrate, it is difficult to cut it with the cutting blade together with the substrate. That is, as the low-k film is extremely fragile like mica, when the above semiconductor wafer is cut along the streets with the cutting blade, the low-k film peels off and consequently, a problem may occur that this peeling reaches the circuits and causes fatal damage to the devices.

To solve the above problem, JP-A 2005-142389 discloses a wafer dividing method of cutting a semiconductor wafer along streets, comprising forming two grooves along the streets formed on the semiconductor wafer to divide the laminate, positioning the cutting blade between the outer sides of the two grooves, and moving the cutting blade and the semiconductor wafer relative to each other.

In the wafer dividing method disclosed by the above patent publication, however, the two grooves are formed along the streets formed on the semiconductor wafer by a laser beam processing machine and then, the portion between the outer sides of the two grooves is cut by a cutting machine. Therefore, there is a problem that the above method has low productivity.

SUMMARY OF THE INVENTION

It is an object of the present invention to provide a wafer processing method capable of efficiently processing a wafer having a plurality of devices which are composed of a laminate consisting of an insulating film and a functional film laminated on the front surface of a substrate, along streets for sectioning the plurality of devices without damaging the devices.

To attain the above object, according to a first aspect of the present invention, there is provided a method of processing a wafer having a plurality of devices which are composed of a laminate consisting of an insulating film and a functional film on the front surface of a substrate, along streets for sectioning the plurality of devices by using a laser beam processing machine which comprises a chuck table for holding a workpiece, a first laser beam application means for applying a laser beam to the workpiece held on the chuck table, a second laser beam application means for applying a laser beam to the workpiece held on the chuck table, a processing-feed means for moving the chuck table, the first laser beam application means and the second laser beam application means relative to one another in a processing-feed direction, and an indexing-feed means for moving the chuck table, the first laser beam application means and the second laser beam application means relative to one another in an indexing-feed direction perpendicular to the processing-feed direction, wherein the method comprises a first trip blocking groove forming step for bringing one end of a street of the wafer held on the chuck table to an application position of a laser beam to be applied from the first laser beam application means and activating the first laser beam application means to apply a laser beam having an output capable of dividing the laminate so as to form a blocking groove in the laminate along the street of the wafer while moving the chuck table, the first laser beam application means and the second laser beam application means relative to one another in a first direction in the processing-feed direction;

a second trip blocking groove and dividing groove forming step for bringing the other end side of a street next to the street which has undergone the above first trip blocking groove forming step to an application position of a laser beam to be applied from the first laser beam application means and also, bringing the other end side of the blocking groove formed along the street by the first trip blocking groove forming step to an application position of a laser beam to be applied from the second laser beam application means, and activating the first laser beam application means to apply a laser beam having an output capable of dividing the laminate so as to form a blocking groove in the laminate along the street of the wafer and also, activating the second laser beam application means to apply a laser beam having an output capable of forming a dividing groove in the substrate so as to form a dividing groove in the substrate along the blocking groove while moving the chuck table, the first laser beam application means and the second laser beam application means relative to one another in a second direction in the processing-feed direction; and a first trip blocking groove and dividing groove forming step for bringing one end side of a street next to the street where the blocking groove has been formed by the second trip blocking groove and dividing groove forming step to an application position of a laser beam to be applied from the first laser beam application means and also bringing one end side of the blocking groove formed by the second trip blocking groove and dividing groove forming step to an application position of a laser beam to be applied from the second laser beam application means, and activating the first laser beam application means to apply a laser beam having an output capable of dividing the laminate so as to form a blocking groove in the laminate along the street of the wafer and also, activating the second laser beam application means to apply a laser beam having an output capable of forming a dividing groove in the substrate so as to form a dividing groove in the substrate along the blocking groove while moving the chuck table, the first laser beam application means and the second laser beam application means relative to one another in the first direction in the processing-feed direction, the second trip blocking groove and dividing groove forming step and the first trip blocking groove and dividing groove forming step being repeated.

According to the present invention, the first trip blocking groove forming step is preceded by a second trip blocking groove and dividing groove forming step in which the application position of a laser beam to be applied from the first laser beam application means and the application position of a laser beam to be applied from the second laser beam application means are arranged on a downstream side of the second direction in the processing-feed direction at a predetermined interval, the other end of a street to be first processed of the wafer held on the chuck table is moved to the application position of a laser beam to be applied from the first laser beam application means, the first laser beam application means is activated to apply a laser beam having an output capable of dividing the laminate so as to form a blocking groove in the laminate along the street of the wafer, and also the second laser beam application means is activated to apply a laser beam having an output capable of forming a dividing groove in the substrate so as to form a dividing groove in the substrate along the blocking groove formed by a laser beam to be applied from the first laser beam application means while moving the chuck table, the first laser beam application means and the second laser beam application means relative to one another in the second direction in the processing-feed direction.

According to a second aspect of the invention, there is provided a method of processing a wafer having a plurality of devices which are composed of a laminate consisting of an insulating film and a functional film on the front surface of a substrate, along streets for sectioning the plurality of devices by using a laser beam processing machine which comprises a chuck table for holding a workpiece, a first laser beam application means for applying a laser beam to the workpiece held on the chuck table, a second laser beam application means for applying a laser beam to the workpiece held on the chuck table, a processing-feed means for moving the chuck table, the first laser beam application means and the second laser beam application means relative to one another in a processing-feed direction, and an indexing-feed means for moving the chuck table, the first laser beam application means and the second laser beam application means relative to one another in an indexing-feed direction perpendicular to the processing-feed direction, wherein the method comprises a first trip blocking groove forming step for bringing one end of a street of the wafer held on the chuck table to the application position of a laser beam to be applied from the first laser beam application means and activating the first laser beam application means to apply a laser beam having an output capable of dividing the laminate so as to form two blocking grooves at a predetermined interval in the laminate along the street of the wafer while moving the chuck table, the first laser beam application means and the second laser beam application means relative to one another in a first direction in the processing-feed direction;

a second trip blocking groove and dividing groove forming step for bringing the other end side of a street next to the street which has undergone the first trip blocking groove forming step to the application position of a laser beam to be applied from the first laser beam application means and also, bringing the other end side of an intermediate portion between the two blocking grooves formed along the street by the first trip blocking groove forming step to the application position of a laser beam to be applied from the second laser beam application means, and activating the first laser beam application means to apply a laser beam having an output capable of dividing the laminate so as to form two blocking grooves in the laminate along the street of the wafer and also, activating the second laser beam application means to apply a laser beam having an output capable of forming a dividing groove in the laminate and the substrate so as to form a dividing groove in the laminate and the substrate along the intermediate portion between the two blocking grooves while moving the chuck table, the first laser beam application means and the second laser beam application means relative to one another in a second direction in the processing-feed direction; and a first trip blocking groove and dividing groove forming step for bringing one end side of a street next to the street where the blocking grooves have been formed by the second trip blocking groove and dividing groove forming step to the application position of a laser beam to be applied from the first laser beam application means and also, bringing one end side of the intermediate portion between the two blocking grooves formed by the second trip blocking groove and dividing groove forming step to the application position of a laser beam applied from the second laser beam application means, and activating the first laser beam application means to apply a laser beam having an output capable of dividing the laminate so as to form two blocking grooves in the laminate along the street of the wafer and also, activating the second laser beam application means to apply a laser beam having an output capable of forming a dividing groove in the laminate and the substrate so as to form a dividing groove in the laminate and the substrate along the intermediate portion between the two blocking grooves while moving the chuck table, the first laser beam application means and the second laser beam application means relative to one another in the first direction in the processing-feed direction, the second trip blocking groove and dividing groove forming step and the first trip blocking groove and dividing groove forming step being repeated.

According to the present invention, the first trip blocking groove forming step is preceded by a second trip blocking groove and dividing groove forming step in which the application position of a laser beam applied from the first laser beam application means and the application position of a laser beam applied from the second laser beam application means are arranged on a downstream side of the second feed direction at a predetermined interval, the other end of a street to be first processed of the wafer held on the chuck table is brought to the application position of a laser beam applied from the first laser beam application means, the first laser beam application means is activated to apply a laser beam having an output capable of dividing the laminate so as to form two blocking grooves in the laminate along the street of the wafer and also the second laser beam application means is activated to apply a laser beam having an output capable of forming a dividing groove in the laminate and the substrate so as to form a dividing groove in the laminate and the substrate along the intermediate portion between the two blocking grooves formed by a laser beam applied from the first laser beam application means while moving the chuck table, the first laser beam application means and the second laser beam application means relative to one another in the second direction in the processing-feed direction.

According to the wafer processing method of the first aspect, since the blocking groove is already formed in the laminate along the street when the dividing groove is to be formed in the substrate of the wafer by the second laser beam application means in the above second trip blocking groove and dividing groove forming step and the first trip blocking groove and dividing groove forming step and a pulse laser beam having an output capable of forming the dividing groove in the substrate along the blocking groove, the laminate does not peel off and does not damage the devices. In addition, the above second trip blocking groove and dividing groove forming step and the first trip blocking groove and dividing groove forming step are carried out during one round trip of the chuck table to form the blocking groove and the dividing groove sequentially. Therefore, the method of the present invention is effective.

According to the wafer processing method of the second aspect, since two blocking groove are already formed in the laminate along the street when the dividing groove is to be formed in the substrate of the wafer by the second laser beam application means in the above second trip blocking groove and dividing groove forming step and the first trip blocking groove and dividing groove forming step and a pulse laser beam having an output capable of forming a dividing groove in the substrate along the intermediate portion between the two blocking grooves is applied, if the laminate peels off, it does not influence the devices as the both sides of the laminate are separated from the devices by the two blocking grooves. In addition, the above second trip blocking groove and dividing groove forming step and the first trip blocking groove and dividing groove forming step are carried out during one round trip of the chuck table to form the two blocking grooves and the dividing groove sequentially. Therefore, the method of the present invention is effective.

BRIEF DESCRIPTION OF THE DRAWINGS

FIGS. 7(a) and 7(b) are explanatory diagrams showing a first trip blocking groove forming step in the first aspect of the wafer processing method of the present invention;

FIGS. 9(a) and 9(b) are explanatory diagrams showing a second trip blocking groove and dividing groove forming step in the first aspect of the wafer processing method of the present invention;

FIGS. 10(a), 10(b) and 10(c) are explanatory diagrams showing the second trip blocking groove and dividing groove forming step in the first aspect of the wafer processing method of the present invention.

FIGS. 12(a) and 12(b) are explanatory diagrams showing a first trip blocking groove and dividing groove forming step in the first aspect of the wafer processing method of the present invention;

FIGS. 13(a), 13(b) and 13(c) are explanatory diagrams showing the first trip blocking groove and dividing groove forming step in the first aspect of the wafer processing method of the first aspect;

FIGS. 16(a) and 16(b) are explanatory diagrams showing a first trip blocking groove forming step according to the another embodiment of the first aspect of the wafer processing method of the present invention;

FIGS. 20(a) and 20(b) are explanatory diagrams showing a first trip blocking groove forming step in the second aspect of the wafer processing method of the present invention;

FIGS. 22(a) and 22(b) are explanatory diagrams showing a second trip blocking groove and dividing groove forming step in the second aspect of the wafer processing method of the present invention;

FIGS. 23(a), 23(b) and 23(c) are explanatory diagrams showing the second trip blocking groove and dividing groove forming step in the second aspect of the wafer processing method of the present invention;

FIGS. 25(a) and 25(b) are explanatory diagrams showing a first trip blocking groove and dividing groove forming step in the second aspect of the wafer processing method of the present invention;

FIGS. 26(a), 26(b) and 26(c) are explanatory diagrams showing the first trip blocking groove and dividing groove forming step in the second aspect of the wafer processing method of the present invention;

FIGS. 29(a) and 29(b) are explanatory diagrams showing a first trip blocking groove forming step according to the another embodiment of the second aspect of the wafer processing method of the present invention.

DETAILED DESCRIPTION OF THE PREFERRED EMBODIMENTS

Preferred embodiments of the wafer processing method of the present invention will be described in detail hereinunder with reference to the accompanying drawings.

Figure 1:
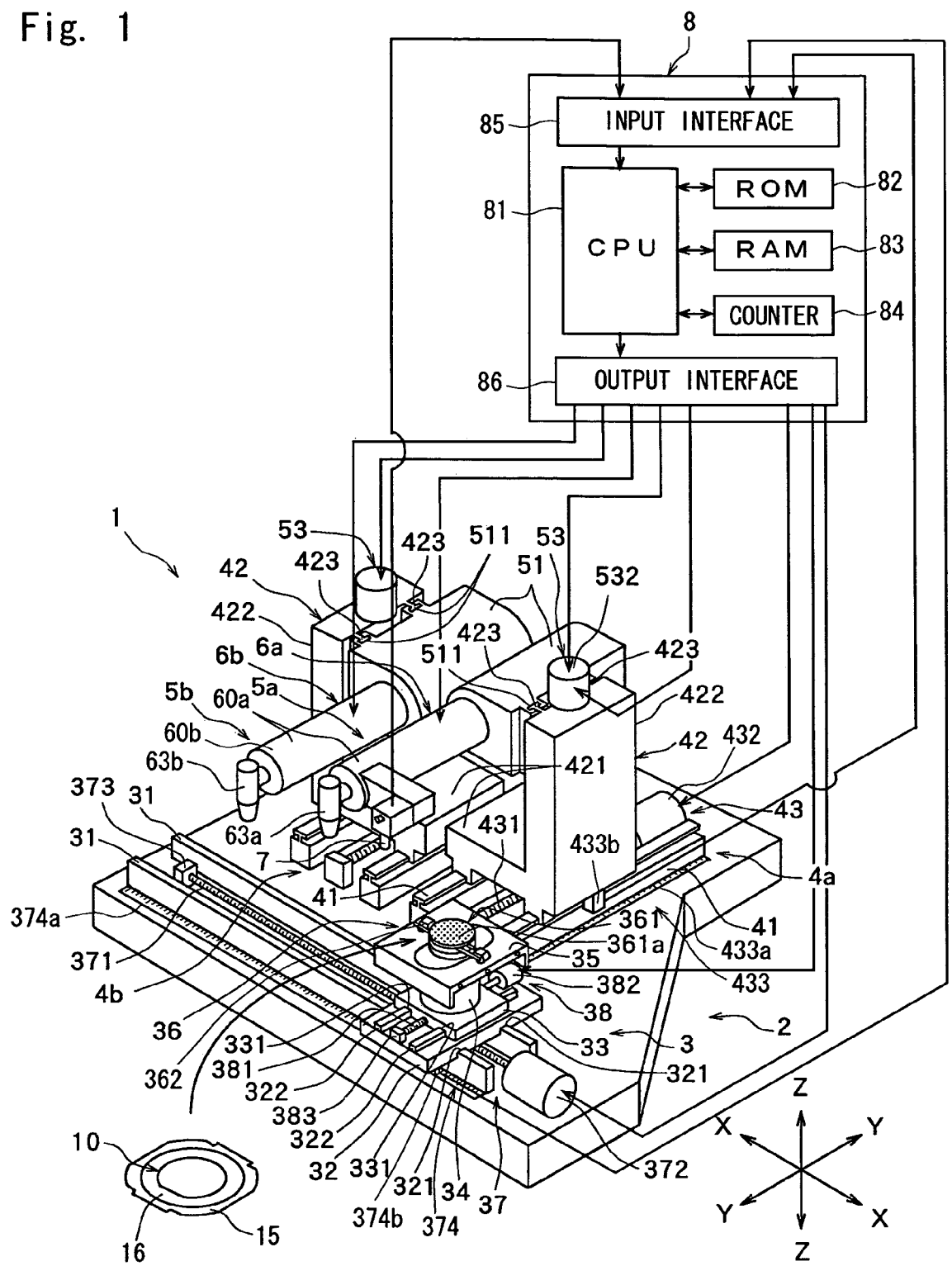
FIG. 1 is a perspective view of a laser beam processing machine for carrying out the wafer processing method of the present invention.

FIG. 1 is a perspective view of a laser beam processing machine for carrying out the wafer processing method of the present invention.

The laser beam processing machine 1 shown in FIG. 1 comprises a stationary base 2, a chuck table mechanism 3 for holding a workpiece, which is mounted on the stationary base 2 in such a manner that it can move in a processing-feed direction (X direction) indicated by an arrow X, a first laser beam application unit support mechanism 4a mounted on the stationary base 2 in such a manner that it can move in an indexing-feed direction (Y direction) indicated by an arrow Y perpendicular to the processing-feed direction (X direction) indicated by the arrow X, a first laser beam application unit 5a mounted on the first laser beam application unit support mechanism 4a in such a manner that it can move in a direction (Z direction) indicated by an arrow Z, a second laser beam application unit support mechanism 4b, and a second laser beam application unit 5b mounted on the second laser beam application unit support mechanism 4b in such a manner that it can move in the direction (Z direction) indicated by the arrow Z.

The above chuck table mechanism 3 comprises a pair of guide rails 31 and 31 which are mounted on the stationary base 2 and arranged parallel to each other in the processing-feed direction (X direction) indicated by the arrow X, a first sliding block 32 mounted on the guide rails 31 and 31 in such a manner that it can move in the direction (X direction) indicated by the arrow X, a second sliding block 33 mounted on the first sliding block 32 in such a manner that it can move in the indexing-feed direction (Y direction) indicated by the arrow Y, a support table 35 supported on the second sliding block 33 by a cylindrical member 34, and a chuck table 36 as a workpiece holding means. This chuck table 36 has an adsorption chuck 361 made of a porous material, and a wafer as a workpiece is held on the workpiece mounting surface 361a of the adsorption chuck 361 by a suction means that is not shown. The chuck table 36 is rotated by a pulse motor (not shown) installed in the cylindrical member 34.

The above first sliding block 32 has, on its undersurface, a pair of to-be-guided grooves 321 and 321 to be fitted to the above pair of guide rails 31 and 31 and, on the top surface, a pair of guide rails 322 and 322 formed parallel to each other in the indexing-feed direction (Y direction) indicated by the arrow Y. The first sliding block 32 constituted as described above can move along the pair of guide rails 31 and 31 in the processing-feed direction (X direction) indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction (X direction) indicated by the arrow X. The processing-feed means 37 has a male screw rod 371 arranged between the above pair of guide rails 31 and 31 parallel to them and a drive source-such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction (X direction) indicated by the arrow X.

The laser beam processing machine 1 in the illustrated embodiment has an X-direction position detection means 374 for detecting the processing-feed position of the above chuck table 36. The X-direction position detection means 374 comprises a linear scale 374a which is arranged along the guide rail 31 and a read head 374b which is mounted on the first sliding block 32 and moves along the linear scale 374a together with the first sliding block 32. The read head 374b of this X-direction position detection means 374 supplies one pulse signal for every 1 μm to a control means which will be described later in the illustrated embodiment. The control means described later counts the input pulse signals to detect the processing-feed position of the chuck table 36. When the pulse motor 372 is used as a drive source for the above processing-feed means 37, the processing-feed position of the chuck table 36 can be detected by counting the drive pulses of the later-described control means for outputting a drive signal to the pulse motor 372. When a servo motor is used as a drive source for the above processing-feed means 37, the processing-feed position of the chuck table 36 can be detected by counting pulse signals, which are outputted from a rotary encoder for detecting the revolution of the servo motor, sent once to the later described control means and then, received input from the control means.

The above second sliding block 33 has, on its undersurface, a pair of to-be-guided grooves 331 and 331 to be fitted to the pair of guide rails 322 and 322 on the top surface of the above first sliding block 32 and can move in the indexing-feed direction (Y direction) indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 along the pair of guide rails 322 and 322 on the first sliding block 32 in the indexing-feed direction (Y direction) indicated by the arrow Y. The first indexing-feed means 38 comprises a male screw rod 381 which is arranged between the above pair of guide rails 322 and 322 parallel to them and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction (Y direction) indicated by the arrow Y.

The above first laser beam application unit support mechanism 4a comprises a pair of guide rails 41 and 41 mounted on the stationary base 2 and arranged parallel to each other in the indexing-feed direction (Y direction) indicated by the arrow Y and a movable support base 42 mounted on the guide rails 41 and 41 in such a manner that it can move in the indexing-feed direction (Y direction) indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction (Z direction) indicated by the arrow Z, that is, the direction perpendicular to the workpiece placing surface 361a of the above chuck table 36 on one of its flanks. The first laser beam application unit support mechanism 4a in the illustrated embodiment comprises a second indexing-feed means 43 for moving the movable support base 42 along the pair of guide rails 41 and 41 in the indexing-feed direction (Y direction) indicated by the arrow Y. This second indexing-feed means 43 has a male screw rod 431 arranged between the above pair of guide rails 41 and 41 parallel to them and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction (Y direction) indicated by the arrow Y. This second indexing-feed means 43 serves as a condenser position adjustment means for adjusting the relative positions in the indexing-feed direction (Y direction) of the first condenser 63a of a first laser beam application means 6a and the second condenser 63b of a second laser beam application means 6b which will be described later.

The laser beam processing machine 1 in the illustrated embodiment comprises a Y-direction position detection means 433 for detecting the indexing-feed position of the movable support base 42 of the above first laser beam application unit support mechanism 4a. This Y-direction position detection means 433 comprises a linear scale 433a which is arranged along the guide rail 41 and a read head 433b which is mounted on the movable support base 42 and moves along the linear scale 433a. The read head 433b of the Y-direction position detection means 433 supplies one pulse signal for every 1 μm to the later-described control means in the illustrated embodiment. The later-described control means counts the input pulse signals to detect the indexing-feed position (the position in the indexing-feed direction (Y direction) relative to the second laser beam application unit 5b which will be described later) of the first laser beam application unit 5a. When the pulse motor 432 is used as a drive source for the above second indexing-feed means 43, the indexing-feed position (the position in the indexing-feed direction (Y direction) relative to the second laser beam application unit 5b) of the first laser beam application unit 5a can be detected by counting the drive pulses of the later described control means for outputting a drive signal to the pulse motor 432. When a servo motor is used as a drive source for the above second indexing-feed means 43, the indexing-feed position (the position in the indexing-feed direction (Y direction) relative to the second laser beam application unit 5b) of the first laser beam application unit 5a can be detected by counting pulse signals, which are outputted from a rotary encoder for detecting the revolution of the servo motor, sent once to the later described control means and then, received input from the control means.

The first laser beam application unit 5a in the illustrated embodiment comprises a unit holder 51 and the first laser beam application means 6a attached to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction (Z direction) indicated by the arrow Z by fitting the to-be-guided grooves 511 and 511 to the above guide rails 423 and 423, respectively. The first laser beam application unit Sa in the illustrated embodiment comprises a focusing point position adjustment means 53 for moving the unit holder 51 along the pair of guide rails 423 and 423 in the direction (Z direction) indicated by the arrow Z. The focusing point position adjustment means 53 has a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the first laser beam application means 6a are moved along the guide rails 423 and 423 in the direction (Z direction) indicated by the arrow Z.

Figure 2:
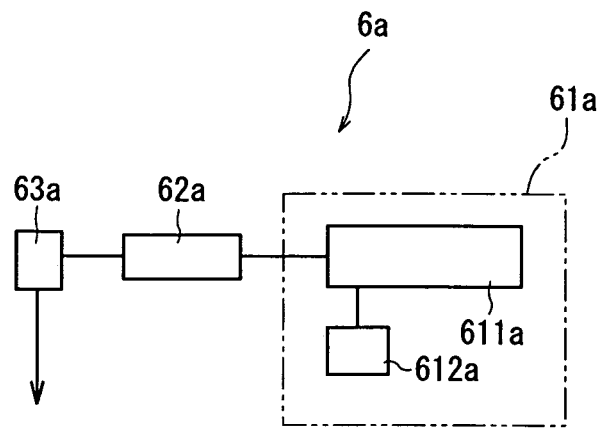
FIG. 2 is a block configuration diagram of a first laser beam application means provided in the laser beam processing machine shown in FIG. 1.

The first laser beam application means 6a comprises a cylindrical casing 60a secured to the above unit holder 51 and extending substantially horizontally. The first laser beam application means 6a further-comprises a pulse laser beam oscillation means 61a and an output adjustment means 62a both of which are installed in the casing 60a and a first condenser 63a mounted onto the end of the above casing 60a as shown in FIG. 2. The above pulse laser beam oscillation means 61a comprises a pulse laser beam oscillator 611a composed of a YAG laser oscillator or YVO4 laser oscillator and a repetition frequency setting means 612a connected to the pulse laser beam oscillator 611a. The pulse laser beam oscillator 611a of this pulse laser beam oscillation means 61a oscillates a pulse laser beam having a wavelength of 355 nm. The output adjustment means 62a adjusts the output of a pulse laser beam oscillated from the pulse laser beam oscillation means 61a to a predetermined value.

An image pick-up means 7 is mounted onto the front end portion of the casing 60a constituting the above first laser beam application means 6a. This image pick-up means 7 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to the control means that is described later.

A description will be subsequently given of the above second laser beam application unit support mechanism 4b and the second laser beam application unit 5b. As for the second laser beam application unit support mechanism 4b and the second laser beam application unit 5b, their constituent members having substantially the same functions as the constituent members of the above first laser beam application unit support mechanism 4a and the first laser beam application unit 5a are given the same reference symbols.

The second laser beam application unit support mechanism 4b is arranged parallel to the above first laser beam application unit support mechanism 4a, and the movable support base 42 of the second laser beam application unit support mechanism 4b is opposed to the movable support base 42 of the above first laser beam application unit support mechanism 4a. Therefore, the first laser beam application unit 5a mounted on the mounting portion 422 constituting the movable support base 42 of the above first laser beam application unit support mechanism 4a and the second laser beam application unit 5b mounted on the mounting portion 422 constituting the movable support base 42 of the second laser beam application unit support mechanism 4b are arranged line-symmetrical at positions close to each other. No image pick-up means is mounted onto the front end portion of a casing 60b constituting the second laser beam application means 6b of the second laser beam application unit 5b.

Figure 3:
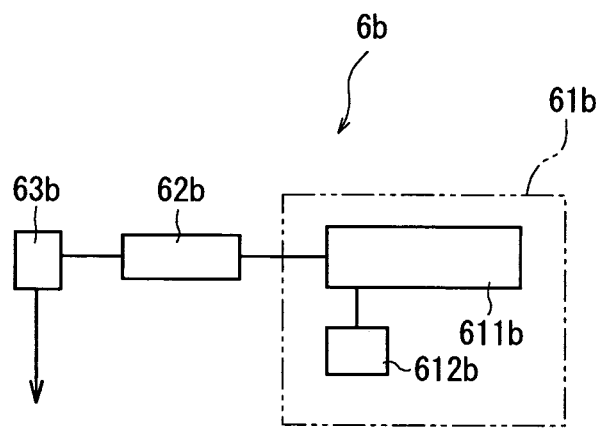
FIG. 3 is a block configuration diagram of a second laser beam application means provided in the laser beam processing machine shown in FIG. 1.

The second laser beam application means 6b comprises a cylindrical casing 60b secured to the unit holder 51 and extending substantially horizontally. The second laser beam application means 6b further comprises a pulse laser beam oscillation means 61b and an output adjustment means 62b both of which are installed in the casing 60b and a second condenser 63b mounted onto the end of the above casing 60b as shown in FIG. 3. The above pulse laser beam oscillation means 61b is constituted by a pulse laser beam oscillator 611b composed of a YVO4 laser oscillator and the repetition frequency setting means 612b connected to the pulse laser beam oscillator 611b. The pulse laser beam oscillator 611b of this pulse laser beam oscillation means 61b oscillates a pulse laser beam having a wavelength of 355 nm. The output adjustment means 62b adjusts the output of a pulse laser beam oscillated from the pulse laser beam oscillation means 61b to a predetermined value. The second condenser 63b of the second laser beam application means 6b and the first condenser 63a of the first laser beam application means 6a are arranged at a predetermined space in the processing-feed direction (X direction) from each other.

The laser beam processing machine 1 in the illustrated embodiment comprises a control means 8. The control means 8 is composed of a computer which comprises a central processing unit (CPU) 81 for carrying out arithmetic processing based on a control program, a read-only memory (ROM) 82 for storing the control program, etc., a read/write random access memory (RAM) 83 for storing the results of operations, a counter 84, an input interface 85 and an output interface 86. Detection signals from the above X-direction position detection means 374, the Y-direction position detection means 433 and the image pick-up means 7 are supplied to the input interface 85 of the control means 8. Control signals are supplied to the above pulse motor 372, pulse motor 382, pulse motor 432, pulse motor 532, the first laser beam application means 6a and the second laser beam application means 6b from the output interface 86 of the control means 8.

The laser beam processing machine 1 in the illustrated embodiment is constituted as described above, and the method of processing the wafer by using this laser beam processing machine 1 will be described hereinbelow.

Figure 4:
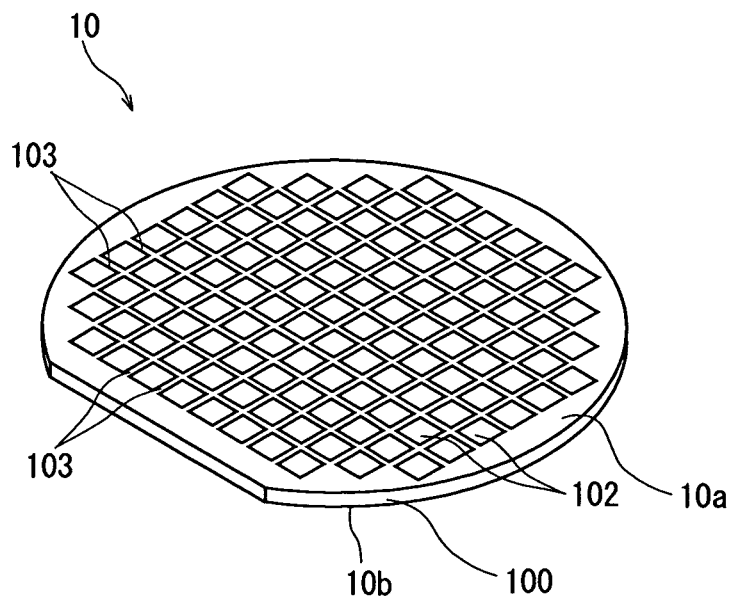
FIG. 4 is a perspective view of a semiconductor wafer as a wafer to be processed by the wafer processing method of the present invention.
Figure 5:
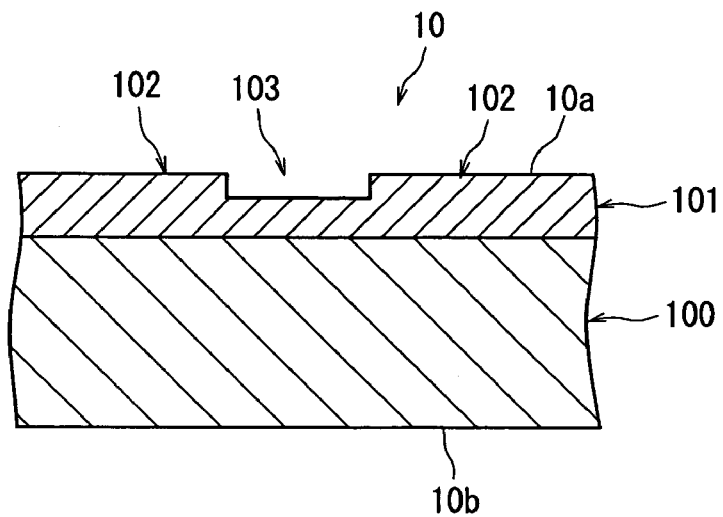
FIG. 5 is an enlarged sectional view of the key section of the semiconductor wafer shown in FIG. 4.

FIG. 4 is a perspective view of a semiconductor wafer as the wafer to be processed by the wafer processing method of the present invention, and FIG. 5 is an enlarged sectional view of the key section of the semiconductor wafer shown in FIG. 4. The semiconductor wafer 10 shown in FIG. 4 and FIG. 5 has a plurality of devices 102 such as IC's or LSI's which are composed of a laminate 101 consisting of an insulating film and a functional film for forming circuits and arranged in a matrix state on the front surface of a substrate 100 such as a silicon substrate. The devices 102 are sectioned by streets 103 formed in a lattice pattern. In the illustrated embodiment, the substrate 100 is made of Si or GaAs and has a thickness of, for example, 60 µm. The laminate 101 has a thickness of 2 to 10 µm, and the insulating film forming the laminate 101 is a low-dielectric constant insulating film (low-k film) made of a glass material such as $SiO_2$, SiO or SiN.

Figure 6:
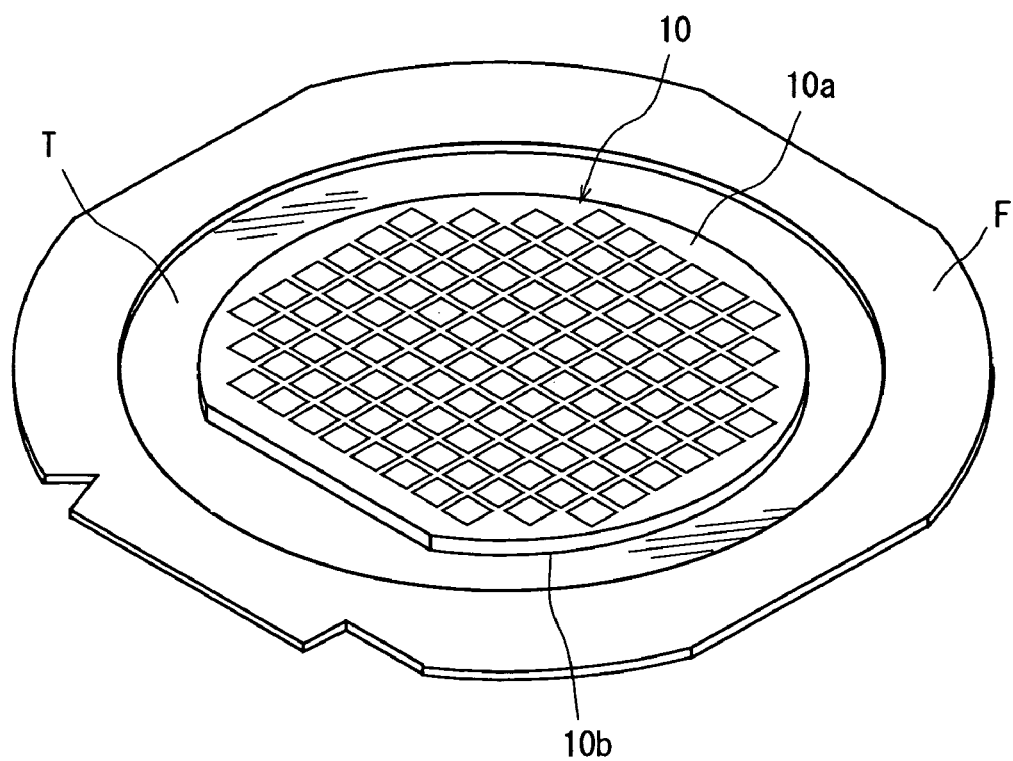
FIG. 6 is a perspective view showing a state of the semiconductor wafer shown in FIG. 4 being put on the front surface of a dicing tape mounted on an annular frame.

To carry out a laser-processing along the streets 103 of the above semiconductor wafer 10, the semiconductor wafer 10 is put on the front surface of a dicing tape T which is a synthetic resin sheet such as a polyolefin sheet and mounted on an annular frame F as shown in FIG. 6. At this point, the rear surface 10b of the semiconductor wafer 10 is put on the front surface of the dicing tape T. Therefore, the front surface 10a of the semiconductor wafer 10 is exposed.

The dicing tape T side of the semiconductor wafer 10 supported to the annular frame F through the dicing tape T is placed on the chuck table 36 of the laser beam processing machine 1 shown in FIG. 1. The semiconductor wafer 10 is then suction-held on the chuck table 36 through the dicing tape T by activating the suction means that is not shown. The annular frame F is fixed by clamps 362.

The chuck table 36 suction-holding the semiconductor wafer 10 as described above is brought to a position right below the image pick-up means 7 by the processing-feed means 37. After the chuck table 36 is positioned right below the image pick-up means 7, alignment work for detecting the area to be processed of the semiconductor wafer 10 is carried out by the image pick-up means 7 and the control means 8. That is, the image pick-up means 7 and the control means 8 carry out image processing such as pattern matching etc. to align a street 103 formed in a predetermined direction of the semiconductor wafer 10 with the first condenser 63a of the first laser beam application means 6a for applying a laser beam along the street 103, thereby performing the alignment of a laser beam application position. The alignment of the laser beam application position is also carried out on streets 103 formed on the semiconductor wafer 10 in a direction perpendicular to the above predetermined direction.

A description will be subsequently given of a first aspect of the wafer processing method of the present invention with reference to FIGS. 7(a) and 7(b) to FIG. 14.

Figure 8:
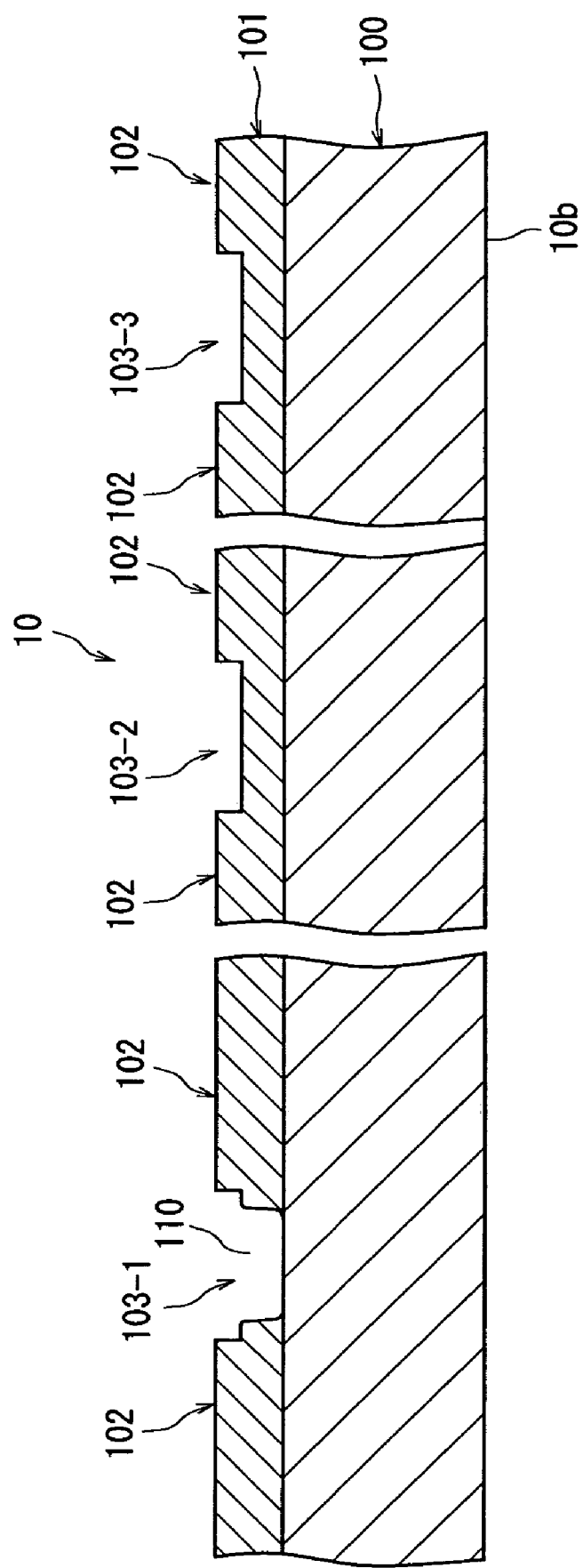
FIG. 8 is an enlarged sectional view of the key section of the semiconductor wafer, which has undergone the first trip blocking groove forming step shown in FIGS. 7(a) and 7(b)

After the alignment of the laser beam application position is carried out by detecting the street 103 formed on the semiconductor wafer 10 held on the chuck table 36 as described above, next comes a first trip blocking groove forming step in which one end of the street 103 of the semiconductor wafer 10 held on the chuck table 36 is brought to an application position of a laser beam to be applied from the first laser beam application means 6a, and the first laser beam application means 6a is activated to apply a laser beam having an output capable of dividing the laminate 101 so as to form a blocking groove in the laminate 101 of the street 103 of the semiconductor wafer 10 while moving the chuck table 36 in a first direction in the processing-feed direction. That is, the control means 8 activates the processing-feed means 37 and the first indexing-feed means 38 to move the chuck table 36 to a laser beam application area where the first condenser 63a of the first laser beam application means 6a is located as shown in FIGS. 7(*a*) and 7(*b*) so as to bring one end (right end in FIG. 7(*a*)) of the predetermined street 103-1 to a position right below the first condenser 63a of the first laser beam application means 6a (the position where a laser beam is applied from the first condenser 63a). And, the focusing point position adjustment means 53 of the first laser beam application means 6a is then activated to adjust the focusing point P1 of a pulse laser beam to be applied from the first condenser 63a so as to be positioned above the front surface 10a of the semiconductor wafer 10 by a predetermined distance (h1). Therefore, the pulse laser beam is applied from the first condenser 63a to the front surface of the semiconductor wafer 10 as a circular spot (S1) having a predetermined diameter larger than the focal spot. The diameter of the spot (S1) is adjusted to become, for example, 30 μm by the focusing point position adjustment means 53. Thereafter, the control means 8 activates the pulse laser beam oscillation means 61a and the output adjustment means 62a of the first laser beam application means 6a to apply a pulse laser beam having an output capable of dividing the laminate 101 from the first condenser 63a while activating the pulse motor 372 of the processing-feed means 37 to move the chuck table 36 in the direction indicated by the arrow X1 in FIG. 7(*a*) (in the first direction in the processing-feed direction) at a predetermined feed rate (for example, 100 mm/sec). And, when the other end (left end in FIG. 7(*a*)) of the street 103-1 reaches a position right below the first condenser 63a of the first laser beam application means 6a, the operation of the first laser beam application means 6a is suspended and the movement of the chuck table 36 is stopped. As a result, a blocking groove 110 having a width of, for example, 30 μm is formed in the laminate 101 of the semiconductor wafer 10 along the street 103-1 as shown in FIG. 8 and hence, the laminate 101 is divided.

The processing conditions in the above first trip blocking groove forming step are set as follows, for example.

Light source: YAG laser
Wavelength: pulse laser beam having a wavelength of 355 nm
Repetition frequency: 100 kHz
Average output: 1 W In the above first trip blocking groove forming step, to form the blocking groove 110 having a predetermined width (for example, 30 μm), the focusing point P1 of the pulse laser beam applied from the first condenser 63a is set to a position the predetermined distance (h1) above the front surface 10a of the semiconductor wafer 10 so as to form the circular spot (S1) larger than the focal spot. A condenser for forming an elliptic spot having a long axis in the Y direction may be used instead.

The above first trip blocking groove forming step is followed by a second trip blocking groove and dividing groove forming step in which the other end side of a street 103 next to the street 103 which has undergone the first trip blocking groove forming step is brought to the application position of a laser beam to be applied from the first laser beam application means 6a and also, the other end side of the blocking groove 110 formed in the street 103 which has undergone the first trip blocking groove forming step is brought to the application position of a laser beam to be applied from the second laser beam application means 6b, and the first laser beam application means 6a is activated to apply a laser beam having an output capable of dividing the laminate 101 so as to form a blocking groove 110 in the laminate 101 along the street 103 of the semiconductor wafer 10, and also, the second laser beam application means 6b is activated to apply a laser beam having an output capable of forming a dividing groove in the substrate 100 so as to form a dividing groove in the substrate 100 along the blocking groove 110 while moving the chuck table 36 in a second direction in the processing-feed direction. That is, after the end of the above first trip blocking groove forming step, the control means 8 activates the first indexing-feed means 38 to move the chuck table 36 in the indexing-feed direction (in the direction perpendicular to the surface of the sheet in FIG. 9(*a*)) so as to bring the other end (left end in FIG. 9(*a*)) of the street 103-2 next to the street 103-1 which has undergone the above first trip blocking groove forming step to a position right below the first condenser 63a of the first laser beam application means 6a (the position where a laser beam is applied from the first condenser 63a) as shown in FIGS. 9(*a*) and 9(*b*).

The positional relationship between the first condenser 63a of the first laser beam application means 6a and the second condenser 63b of the second laser beam application means 6b will be described with reference to FIG. 9(*b*). The second condenser 63b of the second laser beam application means 6b is located on the left side (on a downstream side in the second direction in the processing-feed direction X2) in FIGS. 9(*a*) and 9(*b*) of the first condenser 63a of the first laser beam application means 6a at a predetermined interval L1 in the processing-feed direction (X direction) indicated by the arrow X. Further, the second condenser 63b of the second laser beam application means 6b is situated on the lower side in FIG. 9(*b*) of the first condenser 63a of the first laser beam application means 6a at a predetermined interval L2 in the indexing-feed direction (Y direction) indicated by the arrow Y. The interval L2 in the Y direction between the second condenser 63b of the second laser beam application means 6b and the first condenser 63a of the first laser beam application means 6a is set to the interval between adjacent streets 103. That is, when the street 103-2 next to the street 103-1 which has undergone the first trip blocking groove forming step is positioned right below the first condenser 63a of the first laser beam application means 6a (the application position where a laser beam is applied from the first condenser 63a), the blocking groove 110 formed in the street 103-1 which has undergone the first trip blocking groove forming step is so designed as to be located at a position corresponding to the second condenser 63b of the second laser beam application means 6b. The adjustment of this interval L2 is carried out by activating the second indexing-feed means 43 which serves as the condenser position adjustment means for adjusting the relative positions in the indexing-feed direction (Y direction) of the first condenser 63a of the first laser beam application means 6a and the second condenser 63b of the second laser beam application means 6b to move the movable support base 42 along the guide rails 41 and 41 in the indexing-feed direction (Y direction) indicated by the arrow Y.

Figure 11:
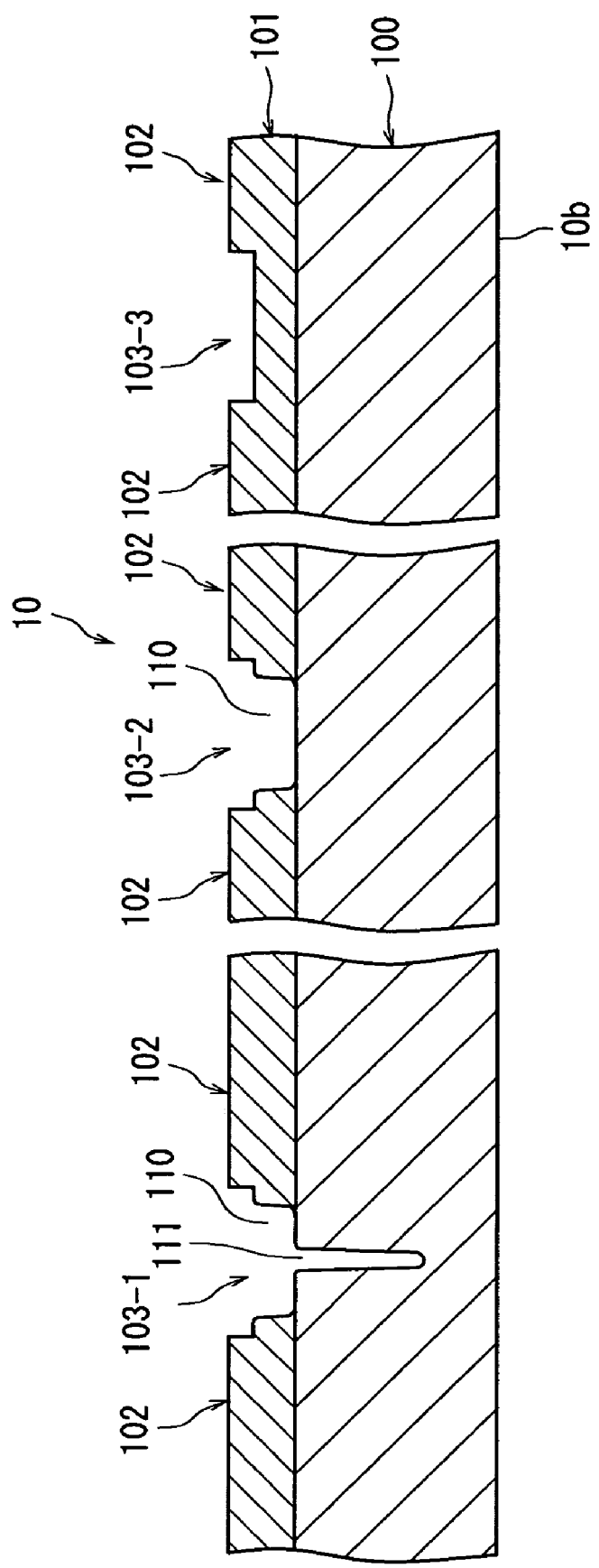
FIG. 11 is an enlarged sectional view of the key section of the semiconductor wafer, which has undergone the second trip blocking groove and dividing groove forming step shown in FIGS. 9(a) and 9(b) and FIGS. 10(a), 10(b) and 10(c)

After the semiconductor wafer 10 held on the chuck table 36 is brought as shown in FIGS. 9(*a*) and 9(*b*), the control means 8 activates the pulse laser beam oscillation means 61a and the output adjustment means 62a of the first laser beam application means 6a to apply a pulse laser beam having an output capable of dividing the laminate 101 from the first condenser 63a while activating the pulse motor 372 of the processing-feed means 37 to move the chuck table 36 in the second direction in the processing-feed direction indicated by the arrow X2 in FIG. 9(*a*) at a predetermined feed rate (for example, 100 mm/sec). And, when the other end (left end in FIG. 10(*a*)) of the street 103-1 reaches a position right below the second condenser 63b of the second laser beam application means 6b as shown in FIG. 10(a), the pulse laser beam oscillation means 61b and the output adjustment means 62b of the second laser beam application means 6b are activated to apply a pulse laser beam having an output capable of forming a dividing groove in the substrate 100 of the semiconductor wafer 10 from the second condenser 63b. The output of the pulse laser beam applied by the second laser beam application means 6b is higher than the output of the pulse laser beam applied by the first laser beam application means 6a. The focusing point P2 of the pulse laser beam applied from the second condenser 63b of the second laser beam application means 6b is so adjusted as to position close to the front surface 10a of the semiconductor wafer 10 by the focusing point position adjustment means 53 of the second laser beam application means 6b. The focal spot of the pulse laser beam applied from the second condenser 63b is set to a diameter of 5 μm in the illustrated embodiment. And, when one end (right end in FIG. 10(b)) of the street 103-2 reaches a position right below the first condenser 63a of the first laser beam application means 6a as shown in FIG. 10(b), the operation of the first laser beam application means 6a is suspended. When the chuck table 36 further moves in the second direction in the processing-feed direction indicated by the arrow X2 and one end (right end in FIG. 10(c)) of the street 103-1 reaches a position right below the second condenser 63b of the second laser beam application means 6b as shown in FIG. 10(c), the operation of the second laser beam application means 6b is suspended and the movement of the chuck table 36 is stopped. As a result, a blocking groove 110 having a width of, for example, 30 μm is formed along the street 103-2 and a dividing groove 111 is formed in the substrate 100 along the blocking groove 110 formed in the street 103-1 in the semiconductor wafer 10 as shown in FIG. 11.

The conditions of processing which is carried out by the first laser beam application means 6a in the above second trip blocking groove and dividing groove forming step may be the same as the processing conditions in the above first trip blocking groove forming step.

The conditions of processing which is carried out by the second laser beam application means 6b in the above second trip blocking groove and dividing groove forming step are set as follows, for example.

Light source: YAG laser
Wavelength: pulse laser beam having a wavelength of 355 nm
Repetition frequency: 20 kHz
Average output: 10 W The above second trip blocking groove and dividing groove forming step is followed by a first trip blocking groove and dividing groove forming step in which one end side of a street next to the street in which the blocking groove 110 has been formed by the second trip blocking groove and dividing groove forming step is brought to the application position of a laser beam to be applied from the first laser beam application means 6a and also one end side of the blocking groove 110 formed by the second trip blocking groove and dividing groove forming step is brought to the application position of a laser beam to be applied from the second laser beam application means 6b, the first laser beam application means 6a is activated to apply a laser beam having an output capable of dividing the laminate 101 so as to form a blocking groove in the laminate 101 along the street of the wafer-while moving the chuck table in the first direction in the processing-feed direction and simultaneously, the second laser beam application means 6b is activated to apply a laser beam having an output capable of forming a dividing groove in the substrate 100 so as to form a dividing groove in the substrate 100 along the blocking groove 110. That is, after the end of the above second trip blocking groove and dividing groove forming step, the control means 8 activates the first indexing-feed means 38 to move the chuck table 36 in the indexing-feed direction (the direction perpendicular to the surface of the sheet in FIG. 10(c)) so as to bring one end (right end in FIG. 12(a)) of the street 103-2 (in which the blocking 110 has been formed) which has undergone the above second trip blocking groove and dividing groove forming step to a position right below the second condenser 63b of the second laser beam application means 6b (the position where a laser beam is applied from the second condenser 63b) as shown in FIGS. 12(a) and 12(b). As a result, the street 103-3 next to the street 103-2 which has undergone the above second trip blocking groove and dividing groove forming step is located to a position corresponding to the first condenser 63a of the first laser beam application means 6a.

Figure 14:
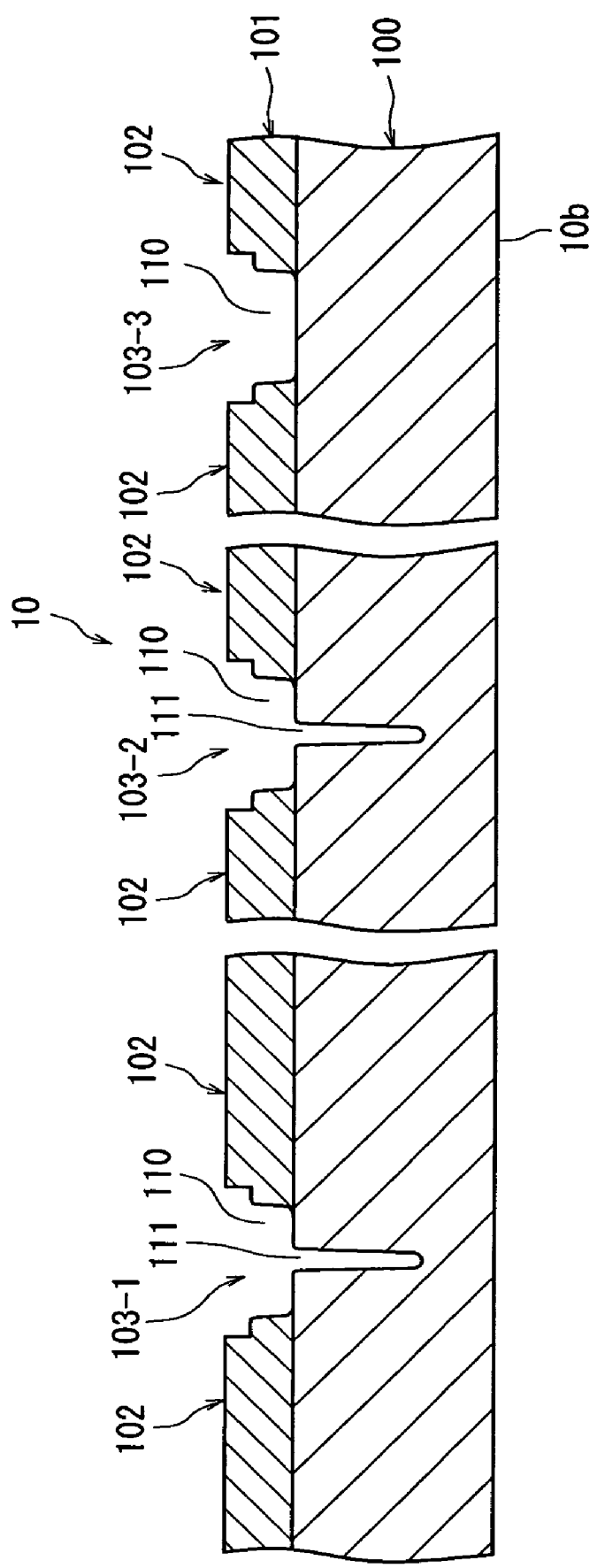
FIG. 14 is an enlarged sectional view of the key section of the semiconductor wafer, which has undergone the first trip blocking groove and dividing groove forming step shown in FIGS. 12(a) and 12(b) and FIGS. 13(a), 13(b) and 13(c)

After the semiconductor wafer 10 held on the chuck table 36 is positioned as shown in FIGS. 12(a) and 12(b), the control means 8 activates the pulse laser beam oscillation means 61b and the output adjustment means 62b of the second laser beam application means 6b to apply a pulse laser beam having an output capable of forming a dividing groove in the substrate 100 of the semiconductor wafer 10 while activating the pulse motor 372 of the processing-feed means 37 to move the chuck table 36 in the first direction in the processing-feed direction indicated by the arrow X1 in FIG. 12(a) at a predetermined feed rate (for example, 100 mm/sec). And, when one end (right end in FIG. 13(a)) of the street 103-3 reaches a position right below the first condenser 63a of the first laser beam application means 6a as shown in FIG. 13(a), the pulse laser beam oscillation means 61a and the output adjustment means 62a of the first laser beam application means 6a are activated to apply a pulse laser beam having an output capable of dividing the laminate 101 from the first condenser 63a. And, when the other end (left end in FIG. 13(a)) of the street 103-2 reaches a position right below the second condenser 63b of the second laser beam application means 6b as shown in FIG. 13(b), the operation of the second laser beam application means 6b is suspended. When the chuck table 36 further moves in the first direction in the processing-feed direction indicated by the arrow X1 and the other end (left end in FIG. 13(a)) of the street 103-3 reaches a position right below the first condenser 63a of the first laser beam application means 6a as shown in FIG. 13(c), the operation of the first laser beam application means 6a is suspended and the movement of the chuck table 36 is stopped. As a result, a blocking groove 110 having a width of, for example, 30 μm is formed along the street 103-3 and a dividing groove 111 is formed in the substrate 100 along the blocking groove 110 formed in the street 103-2 in the semiconductor wafer 10 as shown in FIG. 14.

As described above, when the dividing groove 111 is to be formed in the substrate 100 of the semiconductor wafer 10 by the second laser beam application means 6b in the second trip blocking groove and dividing groove forming step and the first trip blocking groove and dividing groove forming step, the blocking groove 110 has been already formed in the laminate 101 along the street 103. Therefore, as a pulse laser beam having an output capable of forming a dividing groove in the substrate 100 along this blocking groove 110 is applied, the laminate 101 does not peel off and does not damage the devices 102. In addition, the second trip blocking groove and dividing groove forming step and the first trip blocking groove and dividing groove forming step are carried out during one round trip of the chuck table 36 to form the blocking grooves 110 and the dividing grooves 111 sequentially. Therefore, the method of the present invention is efficient.

Subsequently, the above second trip blocking groove and dividing groove forming step and the above first trip blocking groove and dividing groove forming step are carried out repeatedly to form blocking grooves 110 and dividing grooves 111 along all the streets 103 formed in the predetermined direction of the semiconductor wafer 10. In the second trip blocking groove and dividing groove forming step or the first trip blocking groove and dividing groove forming step which is carried out along the last street 103, only the second laser beam application means 6b is activated to form a dividing groove 111 along the previously formed blocking groove 110. After the above blocking groove 110 and the dividing groove 111 are formed along all the streets 103 formed in the predetermined direction of the semiconductor wafer 10, the chuck table 36 is turned at 90° to turn the semiconductor wafer 10 held on the chuck table 36 at 90°. Then, the above first trip blocking groove forming step, the second trip blocking groove and dividing groove forming step and the first trip blocking groove and dividing groove forming step are carried out along all the streets 103 formed on the semiconductor wafer 10 in a direction perpendicular to the above predetermined direction.

After the blocking groove 110 and the dividing groove 111 are formed along all the streets 103 formed on the semiconductor wafer 10 as described above, the semiconductor wafer 10 is carried to the subsequent dividing step.

Figure 15:
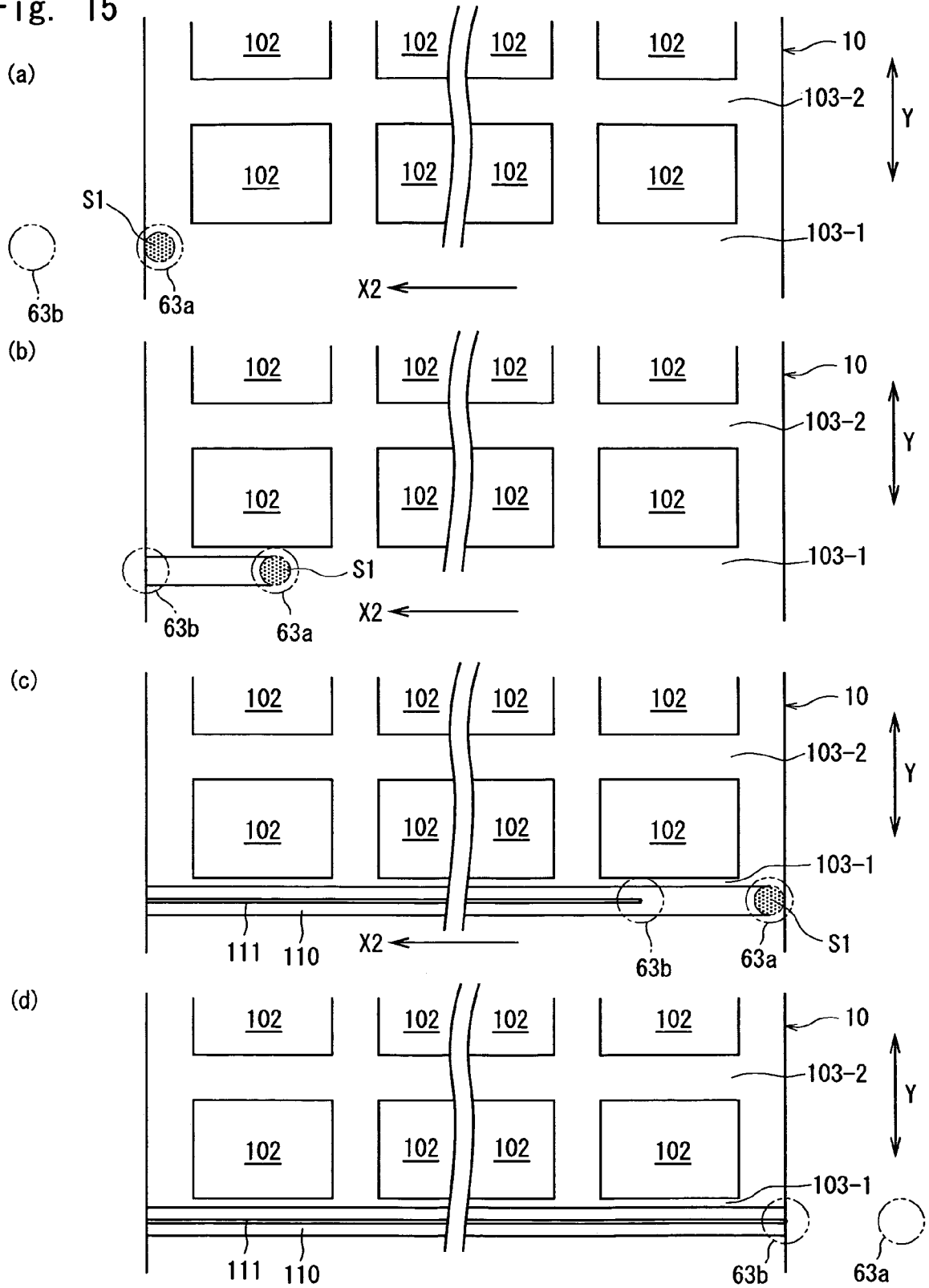
FIGS. 15(a), 15(b), 15(c) and 15(d) are explanatory diagrams showing a second trip blocking groove and dividing groove forming step according to another embodiment of the first aspect of the wafer processing method of the present invention.

Next, a description will be subsequently given of another embodiment with reference to FIGS. 15 (a) to 15(d) and FIGS. 16(a) and 16(b).

In the embodiment shown in FIGS. 15(a) to 15(d) and FIGS. 16(a) and 16(b), the other end (left end in FIG. 15(a)) of the street 103-1 to be first processed of the semiconductor wafer 10 is brought to a position right below the first condenser 63a of the first laser beam application means 6a (the position where a laser beam is applied from the first condenser 63a) as shown in FIG. 15(a). At this point, the second condenser 63b of the second laser beam application means 6b is adjusted so as to be arranged on a straight line with the first condenser 63a of the first laser beam application means 6a in the processing-feed direction (X direction) by the second indexing-feed means 43 which serves as the condenser position adjustment means.

After the semiconductor wafer 10 held on the chuck table 36 is positioned as shown in FIG. 15(a), the control means 8 activates the pulse laser beam oscillation means 61a and the output adjustment means 62a of the first laser beam application means 6a to apply a pulse laser beam having an output capable of dividing the laminate 101 from the first condenser 63a while activating the pulse motor 372 of the processing-feed means 37 to move the chuck table 36 in the second direction in the processing-feed direction indicated by the arrow X2 in FIG. 15(a) at a predetermined feed rate (for example, 100 mm/sec). And, when the other end (left end in FIG. 15(a)) of the street 103-1 reaches a position right below the second condenser 63b of the second laser beam-application means 6b as shown in FIG. 15(b), the pulse laser beam oscillation means 61b and the output adjustment means 62b of the second laser beam application means 6b are activated to apply a pulse laser beam having an output capable of forming a dividing groove in the substrate 100 of the semiconductor wafer 10 from the second condenser 63b. When one end (right end in FIG. 15(c)) of the street 103-1 reaches a position right below the first condenser 63a of the first laser beam application means 6a as shown in FIG. 15(c), the operation of the first laser beam application means 6a is suspended. When the chuck table 36 further moves in the second direction in the processing-feed direction indicated by the arrow X2 and one end (right end in FIG. 15(d)) of the street 103-1 reaches a position right below the second condenser 63b of the second laser beam application means 6b as shown in FIG. 15(d), the operation of the second laser beam application means 6b is suspended and also the movement of the chuck table 36 is stopped. As a result, a blocking groove 110 having a width of, for example, 30 μm is formed along the street 103-1 by the pulse laser beam to be applied from the first condenser 63a of the first laser beam application means 6a and also, a dividing groove 111 is formed in the substrate 100 along the blocking groove 110 by the pulse laser beam to be applied from the second condenser 63b of the second laser beam application means 6b in the semiconductor wafer 10 in such a manner to pursue the blocking groove 110 formed in the street 103-1 (the second trip blocking groove and dividing groove forming step).

After the second trip blocking groove and dividing groove forming step is carried out along the street 103-1 as described above, the first condenser 63a of the first laser beam application means 6a is moved a distance corresponding to the interval between the streets 103 by the second indexing-feed means 43 which serves as the condenser position adjustment means. The processing-feed means 37 and the first indexing-feed means 38 are then activated to bring one end (right end in FIG. 16(a)) of the street 103-2 next to the street 103-1 which has undergone the above second trip blocking groove and dividing groove forming step to a position right below the first condenser 63a of the first laser beam application means 6a (the position where a laser beam is applied from the first condenser 63a) as shown in FIG. 16(a). Then, the control means 8 activates the pulse laser beam oscillation means 61a and the output adjustment means 62a of the first laser beam application means 6a to apply a pulse laser beam having an output capable of dividing the laminate 101 from the first condenser 63a while activating the pulse motor 372 of the processing-feed means 37 to move the chuck table 36 in the first direction in the processing-feed direction indicated by the arrow X1 in FIG. 16(a) at a predetermined feed rate (for example, 100 mm/sec). And, when the other end (left end in FIG. 16(b)) of the street 103-2 reaches a position right below the first condenser 63a of the first laser beam application means 6a as shown in FIG. 16(b), the operation of the first laser beam application means 6a is suspended and the movement of the chuck table 36 is stopped. As a result, a blocking groove 110 having a width of, for example, 30 μm is formed in the laminate 101 of the semiconductor wafer 10 along the street 103-2 and hence, the laminate 101 is divided. Since the second laser beam application means 6b is out of operation during this, this step is substantially the same as the first trip blocking groove forming step of the above embodiment shown in FIGS. 7(a) and 7(b) and FIG. 8. Subsequently, the second trip blocking groove and dividing groove forming step and the first trip blocking groove and dividing groove forming step in the above embodiment are carried out.

Next, a description will be subsequently given of a second aspect of the wafer processing method of the present invention.

Figure 17:
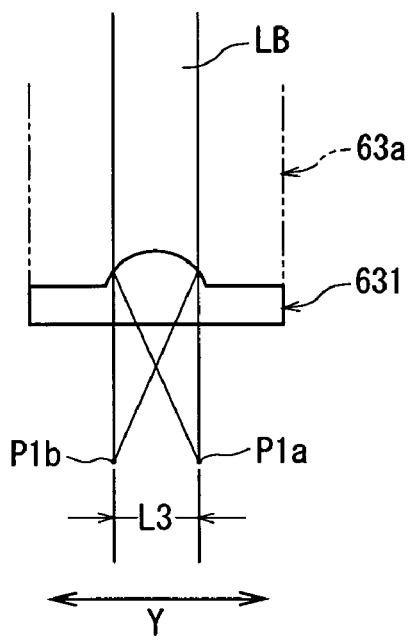
FIG. 17 is an explanatory diagram of the key section of an embodiment of the first laser beam application means for carrying out the second aspect of the wafer processing method of the present invention.
Figure 18:
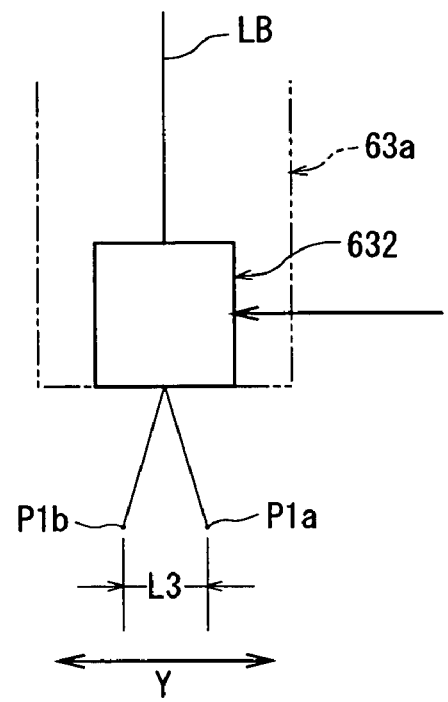
FIG. 18 is an explanatory diagram of the key section of another embodiment of the first laser beam application means for carrying out the second aspect of the wafer processing method of the present invention.
Figure 19:
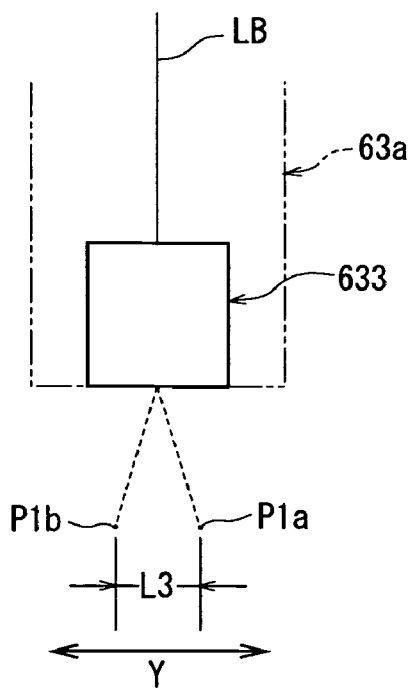
FIG. 19 is an explanatory diagram of the key section of still another embodiment of the first laser beam application means for carrying out the second aspect of the wafer processing method of the present invention.
Figure 21:
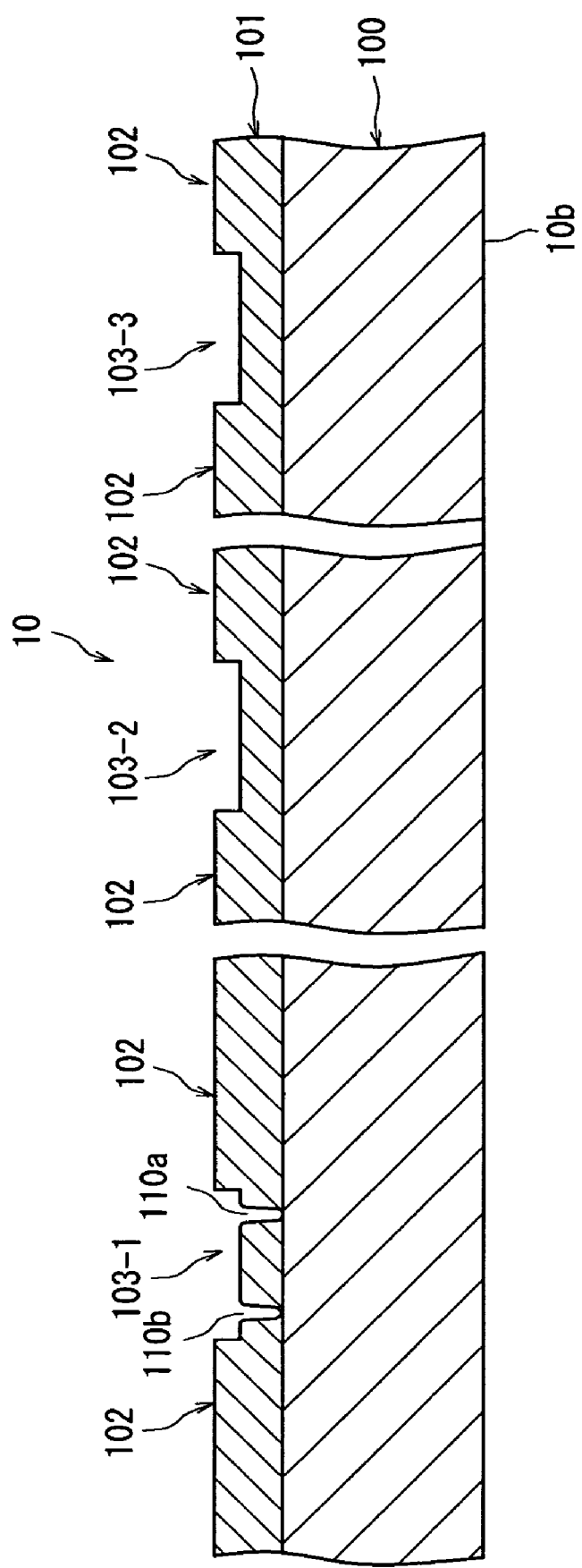
FIG. 21 is an enlarged sectional view of the key section of the semiconductor wafer, which has undergone the first trip blocking groove forming step shown in FIGS. 20(a) and 20(b)

To carry out the wafer processing method of the second aspect, the first laser beam application means 6a is designed to apply a laser beam at a predetermined interval in the indexing-feed direction (Y direction). For example, as shown in FIG. 17, an aspherical lens 631 is used as the condensing lens of the first condenser 63a of the first laser beam application means 6a, and a pulse laser beam (LB) oscillated from the above pulse laser beam oscillation means 61a is designed to be focused at a first focusing point P1a and a second focusing point P1b. The focal spots at the first focusing point P1a and the second focusing point P1b are set to a diameter of 5 μm, and the interval (L3) between the first focusing point P1a and the second focusing point P1b is set to, for example, 30 μm in the illustrated embodiment. As shown in FIG. 18, a beam splitter 632 may also be used to focus the pulse laser beam (LB) oscillated from the above pulse laser beam oscillation means 61a at the first focusing point P1a and the second focusing point P1b. Further, as shown in FIG. 19, an acousto-optic device 633 may also be used to focus the pulse laser beam (LB) oscillated from the above pulse laser beam oscillation means 61a at the first focusing point P1a and the second focusing point P1b alternately by applying two different voltages to the acousto-optic device 633 alternately.

The second aspect of the wafer processing method of the present invention which is carried out by using a laser beam processing machine having the first laser beam application means 6a which is designed so as to focus a pulse laser beam (LB) oscillated from the above pulse laser beam oscillation means 61a at the first focusing point P1a and the second focusing point P1b will be described with reference to FIGS. 20(a) and 20(b) to FIG. 27.

First comes a first trip blocking groove forming step in which one end of a street 103 of the semiconductor wafer 10 held on the chuck table 36 is brought to the application position of a laser beam to be applied from the first laser beam application means 6a as shown in FIGS. 20(a) and 20(b), and the first laser beam application means 6a is activated to apply a laser beam having an output cable of dividing the laminate 101 so as to form two blocking grooves at a predetermined interval in the laminate 101 of the street 103 of the semiconductor wafer 10 while moving the chuck table 36 in the first direction in the processing-feed direction. That is, the control means 8 activates the processing-feed means 37 and the first indexing-feed means 38 to move the chuck table 36 to a laser beam application area where the first condenser 63a of the first laser beam application means 6a is located as shown in FIGS. 20(a) and 20(b) so as to bring one end (right end in FIG. 20(a)) of the predetermined street 103-1 to a position right below the first condenser 63a of the first laser beam application means 6a (the positions of the first focusing point P1a and the second focusing point P1b of a laser beam to be applied from the first condenser 63a). Thereafter, the focusing point position adjustment means 53 of the first laser beam application means 6a is activated to adjust the first focusing point P1a and the second focusing point P1b of the pulse laser beam to be applied from the first condenser 63a so as to become the front surface 10a of the semiconductor wafer 10. Then, the control means 8 activates the pulse laser beam oscillation means 61a and the output adjustment means 62a of the first laser beam application means 6a to apply a pulse laser beam having an output capable of dividing the laminate 101 from the first condenser 63a while activating the pulse motor 372 of the processing-feed means 37 to move the chuck table 36 in the first direction in the processing-feed direction indicated by the arrow X1 in FIG. 20(a) at a predetermined feed rate (for example, 100 mm/sec). And, when the other end (left end in FIG. 20(a)) of the street 103-1 reaches a position right below the first condenser 63a of the first laser beam application means 6a, the operation of the first laser beam application means 6a is suspended and the movement of the chuck table 36 is stopped. As a result, a first blocking groove 110a and a second blocking groove 110b are formed in the laminate 101 of the semiconductor wafer 10 along the street 103-1 at an interval of, for example, 30 μm and hence, the laminate 101 is divided. The processing conditions in this first trip blocking groove forming step may be the same as the processing conditions in the first trip blocking groove forming step in the above first aspect.

After the above first trip blocking groove forming step, next comes a second trip blocking groove and dividing groove forming step in which the other end side of a street 103 next to the street 103 which has undergone the first trip blocking groove forming step is brought to the application position of a laser beam to be applied from the first laser beam application means 6a and also, the other end side of the intermediate portion between the two blocking grooves formed in the street 103 by the first trip blocking groove forming step is brought to the application position of a laser beam to be applied from the second laser beam application means 6b, and the first laser beam application means 6a is activated to apply a laser beam having an output capable of dividing the laminate 101 so as to form two blocking grooves in the laminate 101 along the street 103 of the semiconductor wafer 10 and also, the second laser beam application means 6b is activated to apply a laser beam having an output capable of forming a dividing groove in the laminate 101 and the substrate 100 so as to form a dividing groove in the laminate 101 and the substrate 100 along the intermediate portion between the two blocking grooves (the first blocking groove 110a and the second blocking groove 110b) while moving the chuck table 36 in the second direction in the processing-feed direction. That is, after the end of the above first trip blocking groove forming step, the control means 8 activates the first indexing-feed means 38 to move the chuck table 36 in the indexing-feed direction (the direction perpendicular to the surface of the sheet in FIG. 20(a)) so as to bring the other end (left end in FIG. 22(a)) of the street 103-2 next to the street 103-1 which has undergone the above first trip blocking groove forming step to a position right below the first condenser 63a of the first laser beam application means 6a (the position where a laser beam is applied from the first condenser 63a) as shown in FIG. 22(a) and 22(b).

Here, the positional relationship between the first condenser 63a of the first laser beam application means 6a and the second condenser 63b of the second laser beam application means 6b will be described with reference to FIG. 22(b). The second condenser 63b of the second laser beam application means 6b is located on the left side (on a downstream side in the second direction in the processing-feed direction X2) in FIGS. 22(a) and 22(b) of the first condenser 63a of the first laser beam application means 6a at a predetermined interval L1 in the processing-feed direction (X direction) indicated by the arrow X. Further, the second condenser 63b of the second laser beam application means 6b is situated on the lower side in FIG. 22(b) of the first condenser 63a of the first laser beam application means 6a at a predetermined interval L2 in the indexing-feed direction (Y direction) indicated by the arrow Y. The interval L2 in the Y direction between the second condenser 63b of the second laser beam application means 6b and the first condenser 63a of the first laser beam application means 6a is set to the interval between adjacent streets 103. The adjustment of this interval L2 is carried out by activating the second indexing-feed means 43 which serves as the condenser position adjustment means for adjusting the relative positions in the indexing-feed direction (Y direction) of the first condenser 63a of the first laser beam application means 6a and the second condenser 63b of the second laser beam application means 6b to move the movable support base 42 along the guide rails 41 and 41 in the indexing-feed direction (Y direction) indicated by the arrow Y.

Figure 24:
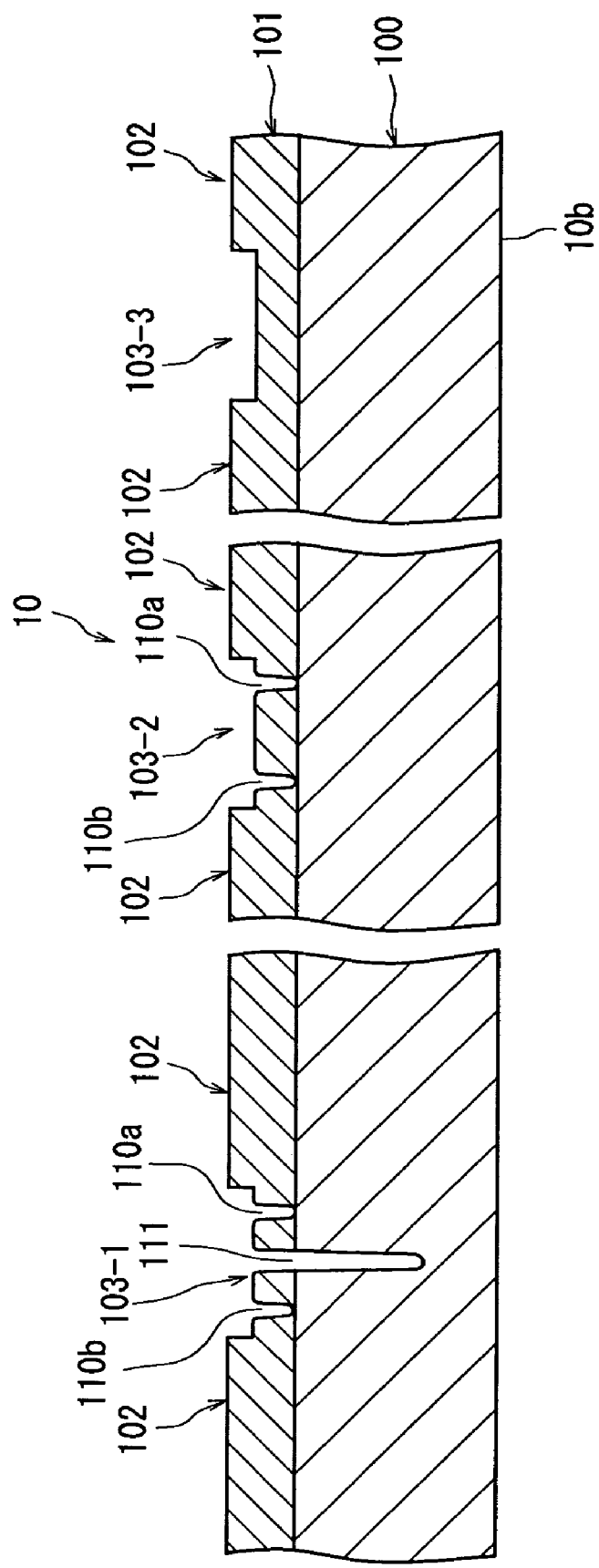
FIG. 24 is an enlarged sectional view of the key section of the semiconductor wafer, which has undergone the second trip blocking groove and dividing groove forming step shown in FIGS. 22(a) and 22(b) and FIGS. 23(a), 23(b) and 23(c)

After the semiconductor wafer 10 held on the chuck table 36 is positioned as shown in FIGS. 22(a) and 22(b), the control means 8 activates the pulse laser beam oscillation means 61a and the output adjustment means 62a of the first laser beam application means 6a to-apply a pulse laser beam having an output capable of dividing the laminate 101 from the first condenser 63a while activating the pulse motor 372 of the processing-feed means 37 to move the chuck table 36 in the second direction in the processing-feed direction indicated by the arrow X2 in FIG. 22(a) at a predetermined feed rate (for example, 100 mm/sec). And, when the other end (left end in FIG. 23(a)) of the street 103-1 reaches a position right below the second condenser 63b of the second laser beam application means 6b as shown in FIG. 23(a), the pulse laser beam oscillation means 61b and the output adjustment means 62b of the second laser beam application means 6b are activated to apply a pulse laser beam having an output capable of forming a dividing groove in the laminate 101 and the substrate 100 of the semiconductor wafer 10 from the second condenser 63b. The output of the pulse laser beam applied from the second laser beam application means 6b is higher than the output of the pulse laser beam applied from the first laser beam application means 6a. The focusing point P2 of the pulse laser beam applied from the second condenser 63b of the second laser beam application means 6b is so adjusted as to position close to the front surface 10a of the semiconductor wafer 10 by the focusing point position adjustment means 53 of the second laser beam application means 6b. The focal spot of the pulse laser beam to be applied from the second condenser 63b is set to a diameter of 5 µm in the illustrated embodiment. Then, when one end (right end in FIG. 23(a)) of the street 103-2 reaches a position right below the first condenser 63a of the first laser beam application means 6a as shown in FIG. 23(b), the operation of the first laser beam application means 6a is suspended. When the chuck table 36 further moves in the second direction in the processing-feed direction indicated by the arrow X2 and one end (right end in FIG. 23(c)) of the street 103-1 reaches a position right below the second condenser 63b of the second laser beam application means 6b as shown in FIG. 23(c), the operation of the second laser beam application means 6b is suspended and the movement of the chuck table 36 is stopped. As a result, a first blocking groove 110a and a second blocking groove 110b are formed along the above street 103-2 at an interval of, for example, 30 µm and also, a dividing groove 111 is formed in the laminate 101 and the substrate 100 along the intermediate portion between the first blocking groove 110a and the second blocking groove 10b formed in the street 103-1 in the semiconductor wafer 10 as shown in FIG. 24. The processing conditions in this second trip blocking groove and dividing groove forming step may be the same as the processing conditions of the second trip blocking groove and dividing groove forming step in the above first aspect.

The above second trip blocking groove and dividing groove forming step is followed by a first trip blocking groove and dividing groove forming step in which one end side of a street next to the street where the blocking grooves 110 have been formed by the second trip blocking groove and dividing groove forming step is brought to the application position of a laser beam to be applied from the first laser beam application means 6a and also, one end side of the intermediate portion between the first blocking groove 110a and the second blocking groove 110b formed by the second trip blocking groove and dividing groove forming step is brought to the application position of a laser beam to be applied from the second laser beam application means 6b, and the first laser beam application means 6a is activated to apply a laser beam having an output capable of dividing the laminate 101 so as to form two blocking grooves in the laminate 101 along the street of the semiconductor wafer 10 and also, the second laser beam application means 6b is activated to apply a laser beam having an output capable of forming a dividing groove in the laminate 101 and the substrate 100 so as to form a dividing groove in the substrate 100 along the intermediate portion between two blocking grooves 110 while moving the chuck table 36 in the first direction in the processing-feed direction. That is, after the end of the above second trip blocking groove and dividing groove forming step, the control means 8 activates the first indexing-feed means 38 to move the chuck table 36 in the indexing-feed direction (the direction perpendicular to the surface of the sheet in FIG. 23(c)) so as to bring one end (right end in FIG. 25(a)) of the street 103-2 (where the blocking grooves 110 have been formed) which has undergone the above second trip blocking groove and dividing groove forming step to a position right below the second condenser 63b of the second laser beam application means 6b (the position where a laser beam is applied from the second condenser 63b) as shown in FIGS. 25(a) and 25(b). As a result, the street 103-3 next to the street 103-2 which has undergone the above second trip blocking groove and dividing groove forming step is located to a position corresponding to the first condenser 63a of the first laser beam application means 6a.

Figure 27:
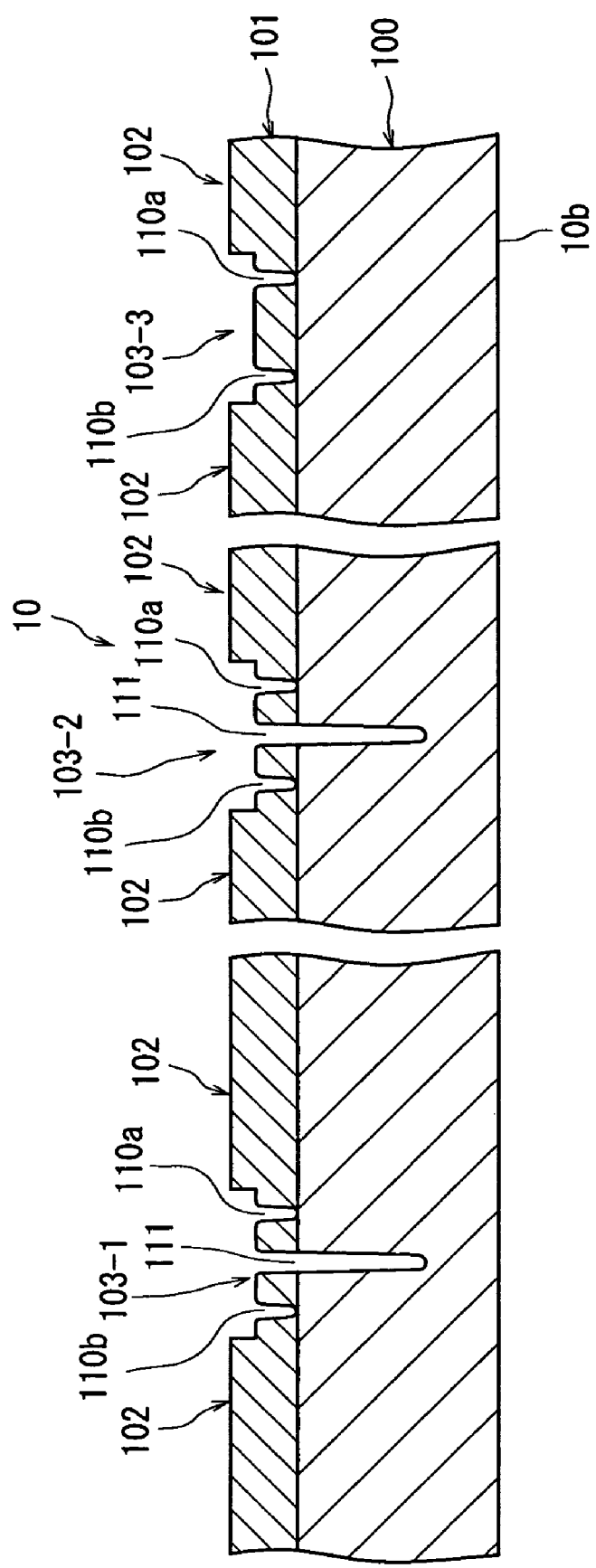
FIG. 27 is an enlarged sectional view of the key section of the semiconductor wafer, which has undergone the first trip blocking groove and dividing groove forming step shown in FIGS. 25(a) and 25(b) and FIGS. 26(a), 26(b) and 26(c)

After the semiconductor wafer 10 held on the chuck table 36 is positioned as shown in FIGS. 25(a) and 25(b), the control means 8 activates the pulse laser beam oscillation means 61b and the output adjustment means 62b of the second laser beam application means 6b to apply a pulse laser beam having an output capable of forming a dividing groove in the laminate 101 and the substrate 100 of the semiconductor wafer 10 while activating the pulse motor 372 of the processing-feed means 37 to move the chuck table 36 in the first direction in the processing-feed direction indicated by the arrow X1 in FIG. 25(a) at a predetermined feed rate (for example, 100 mm/sec). And, when one end (right end in FIG. 26(a)) of the street 103-3 reaches a position right below the first condenser 63a of the first laser beam application means 6a as shown in FIG. 26(a), the pulse laser beam oscillation means 61a and the output adjustment means 62a of the first laser beam application means 6a are activated to apply a pulse laser beam having an output capable of dividing the laminate 101 from the first condenser 63a. Then, when the other end (left end in FIG. 26(a)) of the street 103-2 reaches a position right below the second condenser 63b of the second laser beam application means 6b as shown in FIG. 26(b), the operation of the second laser beam application means 6b is suspended. When the chuck table 36 further moves in the first direction in the processing-feed direction indicated by the arrow X1 and the other end (left end in FIG. 26(a)) of the street 103-3 reaches a position right below the first condenser 63a of the first laser beam application means 6a as shown in FIG. 26(c), the operation of the first laser beam application means 6a is suspended and the movement of the chuck table 36 is stopped. As a result, a first blocking groove 110a and a second blocking groove 110b are formed along the above street 103-3 at an interval of, for example, 30 µm and a dividing groove 111 is also formed in the laminate 101 and the substrate 100 along the intermediate portion between the first blocking groove 110a and the second blocking groove 110b formed in the street 103-2 as shown in FIG. 27.

As described above, since the first blocking groove 110a and the second blocking groove 110b have been formed in the laminate 101 along the street 103 when the dividing groove 111 is formed in the laminate 101 and the substrate 100 of the semiconductor wafer 10 by the second laser beam application means 6b in the second trip blocking groove and dividing groove forming step and the first trip blocking groove and dividing groove forming step and further, a pulse laser beam having an output capable of forming a dividing groove in the laminate 101 and the substrate 100 is applied along the intermediate portion between the first blocking groove 110a and the second blocking groove 110b, even if the laminate peels off, it does not affect the devices because the both sides of the dividing groove 111 are separated from the devices by the two blocking grooves (the first blocking groove 110a and the second blocking groove 110b). In addition, since the second trip blocking groove and dividing groove forming step and the first trip blocking groove and dividing groove forming step are carried out during one round trip of the chuck table 36 to form the blocking grooves 110 and the dividing grooves 111 sequentially. Accordingly, the method of the present invention is efficient.

Thereafter, by repeating the above second trip blocking groove and dividing groove forming step and the above first trip blocking groove and dividing groove forming step, the blocking grooves 110 and the dividing grooves 111 are formed along all the streets 103 formed in the predetermined direction of the semiconductor wafer 10. In the above second trip blocking groove and dividing groove forming step or the first trip blocking groove and dividing groove forming step which is carried out along the last street 103, only the second laser beam application means 6b is activated to form a dividing groove 111 along the intermediate portion between the blocking grooves 110 which have already been formed. After the blocking grooves 110 and the dividing grooves 111 are formed along all the streets 103 formed in the predetermined direction of the semiconductor wafer 10 as described above, the chuck table 36 is turned at 90° to turn the semiconductor wafer 10 held on the chuck table 36 at 90°. Then, the above first trip blocking groove forming step, the second trip blocking groove and dividing groove forming step and the first trip blocking groove and dividing groove forming step are carried out along all the streets 103 formed on the semiconductor wafer 10 in a direction perpendicular to the above predetermined direction.

Next, a description will be subsequently given of another embodiment with reference to FIGS. 28(a) to 28(d) and FIGS. 29(a) and 29(b).

Figure 28:
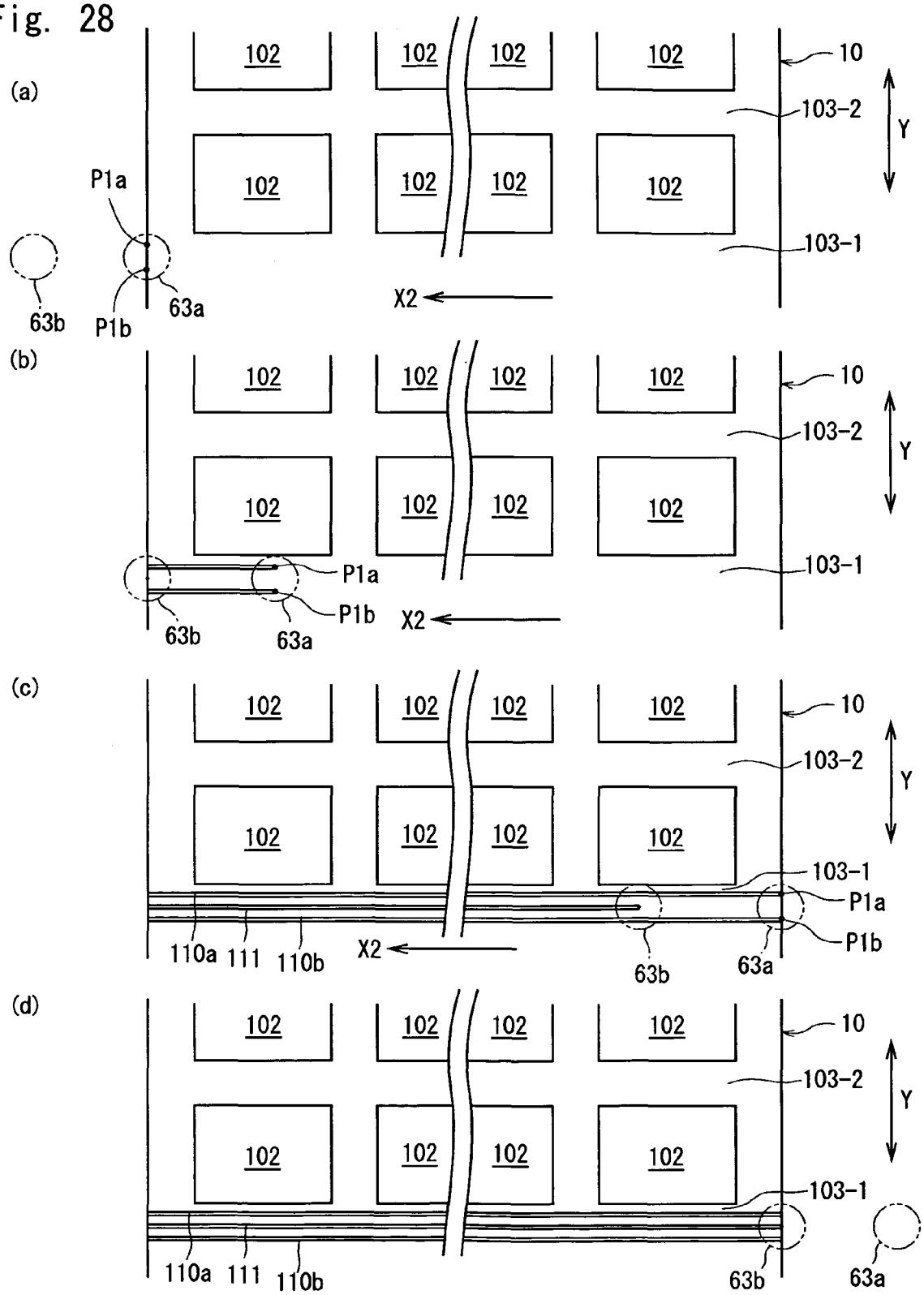
FIGS. 28(a), 28(b), 28(c) and 28(d) are explanatory diagrams showing a second trip blocking groove and dividing groove forming step according to another embodiment of the second aspect of the wafer processing method of the present invention.

In the embodiment shown in FIGS. 28(a) to 28(d) and FIGS. 29(a) and 29(b), the other end (left end in FIG. 28(a)) of the street 103-1 to be first-processed of the semiconductor wafer 10 is brought to a position right below the first condenser 63a of the first laser beam application means 6a (the position where a laser beam is applied from the first condenser 63a) as shown in FIG. 28(a). At this point, the second condenser 63b of the second laser beam application means 6b is adjusted so as to be arranged on a straight line with the first condenser 63a of the first laser beam application means 6a in the processing-feed direction (X direction) by the second indexing-feed means 43 which serves as the condenser position adjustment means.

After the semiconductor wafer 10 held on the chuck table 36 is positioned as shown in FIG. 28(a), the control means 8 activates the pulse laser beam oscillation means 61a and the output adjustment means 62a of the first laser beam application means 6a to apply a pulse laser beam having an output capable of dividing the laminate 101 from the first condenser 63a while activating the pulse motor 372 of the processing-feed means 37 to move the chuck table 36 in the second direction in the processing-feed direction indicated by the arrow X2 in FIG. 28(a) at a predetermined feed rate (for example, 100 mm/sec). And, when the other end (left end in FIG. 28(b)) of the street 103-1 reaches a position right below the second condenser 63b of the second laser beam-application means 6b as shown in FIG. 28(b), the pulse laser beam oscillation means 61b and the output adjustment means 62b of the second laser beam application means 6b are activated to apply a pulse laser beam having an output capable of forming a dividing groove in the laminate 101 and the substrate 100 of the semiconductor wafer 10 from the second condenser 63b. Then, when one end (right end in FIG. 28(c)) of the street 103-1 reaches a position right below the first condenser 63a of the first laser beam application means 6a as shown in FIG. 28(c), the operation of the first laser beam application means 6a is suspended. When the chuck table 36 further moves in the second direction in the processing-feed direction indicated by the arrow X2 and one end (right end in FIG. 28(d)) of the street 103-1 reaches a position right below the second condenser 63b of the second laser beam application means 6b as shown in FIG. 28(d), the operation of the second laser beam application means 6b is suspended and the movement of the chuck table 36 is stopped. As a result, a first blocking groove 110a and a second blocking groove 110b are formed along the above street 103-1 at an interval of, for example, 30 μm by the pulse laser beam to be applied from the first condenser 63a of the first laser beam application means 6a and also, a dividing groove 111 is formed in the laminate 101 and the substrate 100 along the intermediate portion between the first blocking groove 110a and the second blocking groove 110b in such a manner to pursue the first blocking groove 110a and the second blocking groove 110b formed in the street 103-1. (the second trip blocking groove and dividing groove forming step)

After the second trip blocking groove and dividing groove forming step is carried out along the street 103-1 as described above, the first condenser 63a of the first laser beam application means 6a is moved a distance corresponding to the interval between the streets 103 by the second indexing-feed means 43 which serves as the condenser position adjustment means. And, the processing-feed means 37 and the first indexing-feed means 38 are activated to bring one end (right end in FIG. 29(a)) of the street 103-2 next to the street 103-1 which has undergone the above second trip blocking groove and dividing groove forming step to a position right below the first condenser 63a of the first laser beam application means 6a (the position where a laser beam is applied from the first condenser 63a) as shown in FIG. 29(a). Then, the control means 8 activates the pulse laser beam oscillation means 61a and the output adjustment means 62a of the first laser beam application means 6a to apply a pulse laser beam having an output capable of dividing the laminate 101 from the first condenser 63a while activating the pulse motor 372 of the processing-feed means 37 to move the chuck table 36 in the first direction in the processing-feed direction indicated by the arrow X1 in FIG. 29(a) at a predetermined feed rate (for example, 100 mm/sec). And, when the other end (left end in FIG. 29(b)) of the street 103-2 reaches a position right below the first condenser 63a of the first laser beam application means 6a, the operation of the first laser beam application means 6a is suspended and the movement of the chuck table 36 is stopped. As a result, two blocking grooves 110 are formed at an interval of, for example, 30 μm in the laminate 101 of the semiconductor wafer 10 along the street 103-2 and hence, the laminate 101 is divided. Since the second laser beam application means 6b is out of operation during this, this step is substantially the same as the first trip blocking forming step of the above embodiment shown in FIGS. 20(a) and 20(b) and FIG. 21. Subsequently, the second trip blocking groove and dividing groove forming step and the first trip blocking groove and dividing groove forming step in the above embodiment are carried out.

While the invention has been described as related to the embodiments shown in the accompanying drawings, it is to be understood that the invention is not limited thereto but various changes and modifications may be made without departing from the scope and spirit of the invention. For instance, in the above embodiments, the chuck table 36 is moved in the processing-feed direction (X direction) by the processing-feed means. However, the first laser beam application means 6a and the second laser beam application means 6b may be designed to be moved in the processing-feed direction (X direction). In this case, the first direction and the second direction in the processing-feed direction in the wafer processing method are reversed.

What is claimed is:

1. A method of processing a wafer having a plurality of devices which are composed of a laminate consisting of an insulating film and a functional film on the front surface of a substrate, along streets for sectioning the plurality of devices by using a laser beam processing machine which comprises a chuck table for holding a workpiece, a first laser beam application means for applying a laser beam to the workpiece held on the chuck table, a second laser beam application means for applying a laser beam to the workpiece held on the chuck table, a processing-feed means for moving the chuck table, the first laser beam application means and the second laser beam application means relative to one another in a processing-feed direction, and an indexing-feed means for moving the chuck table, the first laser beam application means and the second laser beam application means relative to one another in an indexing-feed direction perpendicular to the processing-feed direction, wherein the method comprises a first trip blocking groove forming step for bringing one end of a street of the wafer held on the chuck table to an application position of a laser beam to be applied from the first laser beam application means and activating the first laser beam application means to apply a laser beam having an output capable of dividing the laminate so as to form a blocking groove in the laminate along the street of the wafer while moving the chuck table, the first laser beam application means and the second laser beam application means relative to one another in a first direction in the processing-feed direction;

a second trip blocking groove and dividing groove forming step for bringing the other end side of a street next to the street which has undergone the above first trip blocking groove forming step to an application position of a laser beam to be applied from the first laser beam application means and also, bringing the other end side of the blocking groove formed along the street by the first trip blocking groove forming step to an application position of a laser beam to be applied from the second laser beam application means, and activating the first laser beam application means to apply a laser beam having an output capable of dividing the laminate so as to form a blocking groove in the laminate along the street of the wafer and also, activating the second laser beam application means to apply a laser beam having an output capable of forming a dividing groove in the substrate so as to form a dividing groove in the substrate along the blocking groove while moving the chuck table, the first laser beam application means and the second laser beam application means relative to one another in a second direction in the processing-feed direction; and a first trip blocking groove and dividing groove forming step for bringing one end side of a street next to the street where the blocking groove has been formed by the second trip blocking groove and dividing groove forming step to an application position of a laser beam to be applied from the first laser beam application means and also bringing one end side of the blocking groove formed by the second trip blocking groove and dividing groove forming step to an application position of a laser beam to be applied from the second laser beam application means, and activating the first laser beam application means to apply a laser beam having an output capable of dividing the laminate so as to form a blocking groove in the laminate along the street of the wafer and also, activating the second laser beam application means to apply a laser beam having an output capable of forming a dividing groove in the substrate so as to-form a dividing groove in the substrate along the blocking groove while moving the chuck table, the first laser beam application means and the second laser beam application means relative to one another in the first direction in the processing-feed direction, the second trip blocking groove and dividing groove forming step and the first trip blocking groove and dividing groove forming step being repeated.

2. The wafer processing method according to claim 1, wherein the first trip blocking groove forming step is preceded by a second trip blocking groove and dividing groove forming step in which the application position of a laser beam to be applied from the first laser beam application means and the application position of a laser beam to be applied from the second laser beam application means are arranged on a downstream side of the second direction in the processing-feed direction at a predetermined interval, the other end of a street to be first processed of the wafer held on the chuck table is brought to the application position of a laser beam to be applied from the first laser beam application means, the first laser beam application means is activated to apply a laser beam having an output capable of dividing the laminate so as to form a blocking groove in the laminate along the street of the wafer and also, the second laser beam application means is activated to apply a laser beam having an output capable of forming a dividing groove in the substrate so as to form a dividing groove in the substrate along the blocking groove formed by a laser beam to be applied from the first laser beam application means while moving the chuck table, the first laser beam application means and the second laser beam application means relative to one another in the second direction in the processing-feed direction.

3. A method of processing a wafer having a plurality of devices which are composed of a laminate consisting of an insulating film and a functional film on the front surface of a substrate, along streets for sectioning the plurality of devices by using a laser beam processing machine which comprises a chuck table for holding a workpiece, a first laser beam application means for applying a laser beam to the workpiece held on the chuck table, a second laser beam application means for applying a laser beam to the workpiece held on the chuck table, a processing-feed means for moving the chuck table, the first laser beam application means and the second laser beam application means relative to one another in a processing-feed direction, and an indexing-feed means for moving the chuck table, the first laser beam application means and the second laser beam application means relative to one another in an indexing-feed direction perpendicular to the processing-feed direction, wherein the method comprises a first trip blocking groove forming step for bringing one end of a street of the wafer held on the chuck table to the application position of a laser beam to be applied from the first laser beam application means and activating the first laser beam application means to apply a laser beam having an output capable of dividing the laminate so as to form two blocking grooves at a predetermined interval in the laminate along the street of the wafer while moving the chuck table, the first laser beam application means and the second laser beam application means relative to one another in a first direction in the processing-feed direction;

a second trip blocking groove and dividing groove forming step for bringing the other end side of a street next to the street which has undergone the first trip blocking groove forming step to the application position of a laser beam to be applied from the first laser beam application means and also, bringing the other end side of an intermediate portion between the two blocking grooves formed along the street by the first trip blocking groove forming step to the application position of a laser beam to be applied from the second laser beam application means, and activating the first laser beam application means to apply a laser beam having an output capable of dividing the laminate so as to form two blocking grooves in the laminate along the street of the wafer and also, activating the second laser beam application means to apply a laser beam having an output capable of forming a dividing groove in the laminate and the substrate so as to form a dividing groove in the laminate and the substrate along the intermediate portion between the two blocking grooves while moving the chuck table, the first laser beam application means and the second laser beam application means relative to one another in a second direction in the processing-feed direction; and a first trip blocking groove and dividing groove forming step for bringing one end side of a street next to the street where the blocking grooves have been formed by the second trip blocking groove and dividing groove forming step to the application position of a laser beam to be applied from the first laser beam application means and also, bringing one end side of the intermediate portion between the two blocking grooves formed by the second trip blocking groove and dividing groove forming step to the application position of a laser beam applied from the second-laser beam application means, and activating the first laser beam application means to apply a laser beam having an output capable of dividing the laminate so as to form two blocking grooves in the laminate along the street of the wafer and also, activating the second laser beam application means to apply a laser beam having an output capable of forming a dividing groove in the laminate and the substrate so as to form a dividing groove in the laminate and the substrate along the intermediate portion between the two blocking grooves while moving the chuck table, the first laser beam application means and the second laser beam application means relative to one another in the first direction in the processing-feed direction, the second trip blocking groove and dividing groove forming step and the first trip blocking groove and dividing groove forming step being repeated.

4. The wafer processing method according to claim 3, wherein the first trip blocking groove forming step is preceded by a second trip blocking groove and dividing groove forming step in which the application position of a laser beam applied from the first laser beam application means and the application position of a laser beam applied from the second laser beam application means are arranged on a downstream side of the second feed direction at a predetermined interval, the other end of a street to be first processed of the wafer held on the chuck table is brought to the application position of a laser beam applied from the first laser beam application means, the first laser beam application means is activated to apply a laser beam having an output capable of dividing the laminate so as to form two blocking grooves in the laminate along the street of the wafer and also the second laser beam application means is activated to apply a laser beam having an output capable of forming a dividing groove in the laminate and the substrate so as to form a dividing groove in the laminate and the substrate along the intermediate portion between the two blocking grooves formed by a laser beam applied from the first laser beam application means while moving the chuck table, the first laser beam application means and the second laser beam application means relative to one another in the second direction in the processing-feed direction.

* * * * *